US012615776B2

(12) United States Patent
Kang et al.

(10) Patent No.: US 12,615,776 B2
(45) Date of Patent: Apr. 28, 2026

(54) THREE DIMENSIONAL SEMICONDUCTOR DEVICE HAVING A BACK-GATE ELECTRODE

(71) Applicants: SK hynix Inc., Icheon (KR); Industry-University Cooperation Foundation Hanyang University, Seoul (KR)

(72) Inventors: In Ku Kang, Icheon (KR); Chang Han Kim, Icheon (KR); Yun Heub Song, Seoul (KR); Jae Min Sim, Seoul (KR)

(73) Assignees: SK hynix Inc., Icheon (KR); Industry-University Cooperation Foundation Hanyang University, Seoul (KR)

( * ) Notice: Subject to any disclaimer, the term of this patent is extended or adjusted under 35 U.S.C. 154(b) by 481 days.

(21) Appl. No.: 18/159,570

(22) Filed: Jan. 25, 2023

(65) Prior Publication Data

US 2024/0049467 A1 Feb. 8, 2024

(30) Foreign Application Priority Data

Aug. 5, 2022 (KR) ........................ 10-2022-0097860

(51) Int. Cl.
| | |
|---|---|
| *H10B 43/27* | (2023.01) |
| *H10B 43/10* | (2023.01) |
| *H10W 20/41* | (2026.01) |

(52) U.S. Cl.
CPC ............. *H10B 43/27* (2023.02); *H10B 43/10* (2023.02); *H10W 20/435* (2026.01)

(58) Field of Classification Search
CPC ........ H10B 43/27; H10B 43/10; H10B 43/30; H10B 43/40; H10B 43/50; H10D 64/037;
(Continued)

(56) References Cited

U.S. PATENT DOCUMENTS

| | | | |
|---|---|---|---|
| 2012/0228697 A1* | 9/2012 | Youm | H10B 41/27 |
| | | | 257/329 |
| 2015/0155297 A1* | 6/2015 | Eom | H10D 30/693 |
| | | | 438/268 |

(Continued)

FOREIGN PATENT DOCUMENTS

| | | |
|---|---|---|
| KR | 10-2012-0103044 A | 9/2012 |
| KR | 10-2015-0062768 A | 6/2015 |

(Continued)

OTHER PUBLICATIONS

Jae-Min Sim et al., "Gate All around with Back Gate NAND Flash Structure for Excellent Reliability Characteristics in Program Operation", Electronics 2021, 10, 1828, Jul. 30, 2021.

*Primary Examiner* — Jacob Y Choi
*Assistant Examiner* — Grace Cha

(57) ABSTRACT

A three dimensional semiconductor device is disclosed. The tree dimensional semiconductor device includes a word line stack over a substrate and a channel pillar structure passing through the word line stack in a vertical direction perpendicular to a top surface of the substrate. The channel pillar structure includes a channel structure. The channel structure includes a blocking layer, a trap layer, a tunneling layer, a channel layer, a filling layer, and a back gate electrode. The channel structure has a pillar shape.

19 Claims, 26 Drawing Sheets

(58) Field of Classification Search
 CPC . H10D 30/693; H10D 30/696; H01L 23/5283
 See application file for complete search history.

(56) References Cited

U.S. PATENT DOCUMENTS

| | | | | |
|---|---|---|---|---|
| 2015/0311301 A1* | 10/2015 | Seol | ....................... | H10D 88/00 |
| | | | | 257/325 |
| 2016/0163729 A1* | 6/2016 | Zhang | .................... | H10D 30/69 |
| | | | | 257/324 |
| 2021/0036011 A1* | 2/2021 | Son | .......................... | G11C 8/14 |

FOREIGN PATENT DOCUMENTS

| | | | |
|---|---|---|---|
| KR | 1020150138713 | A | 12/2015 |
| KR | 10-2017-0093099 | A | 8/2017 |
| KR | 101946179 | B1 | 2/2019 |
| KR | 10-2020-0018064 | A | 2/2020 |
| KR | 1020210015078 | A | 2/2021 |
| KR | 1020210158289 | A | 12/2021 |
| KR | 1020220028776 | A | 3/2022 |
| KR | 1020220036208 | A | 3/2022 |
| KR | 1020220052684 | A | 4/2022 |
| KR | 1020220057049 | A | 5/2022 |

* cited by examiner

FIG. 3

WSp 17
31
16
31
16
31
16
16
31
16
31
16
15
23 14b
22 14a
21
11

CSp

H1

10

II'          II

WSp 17
31
16
31
16
31
16
16
31
16
31
16
15
23 14b
22 14a
21
11

CSp

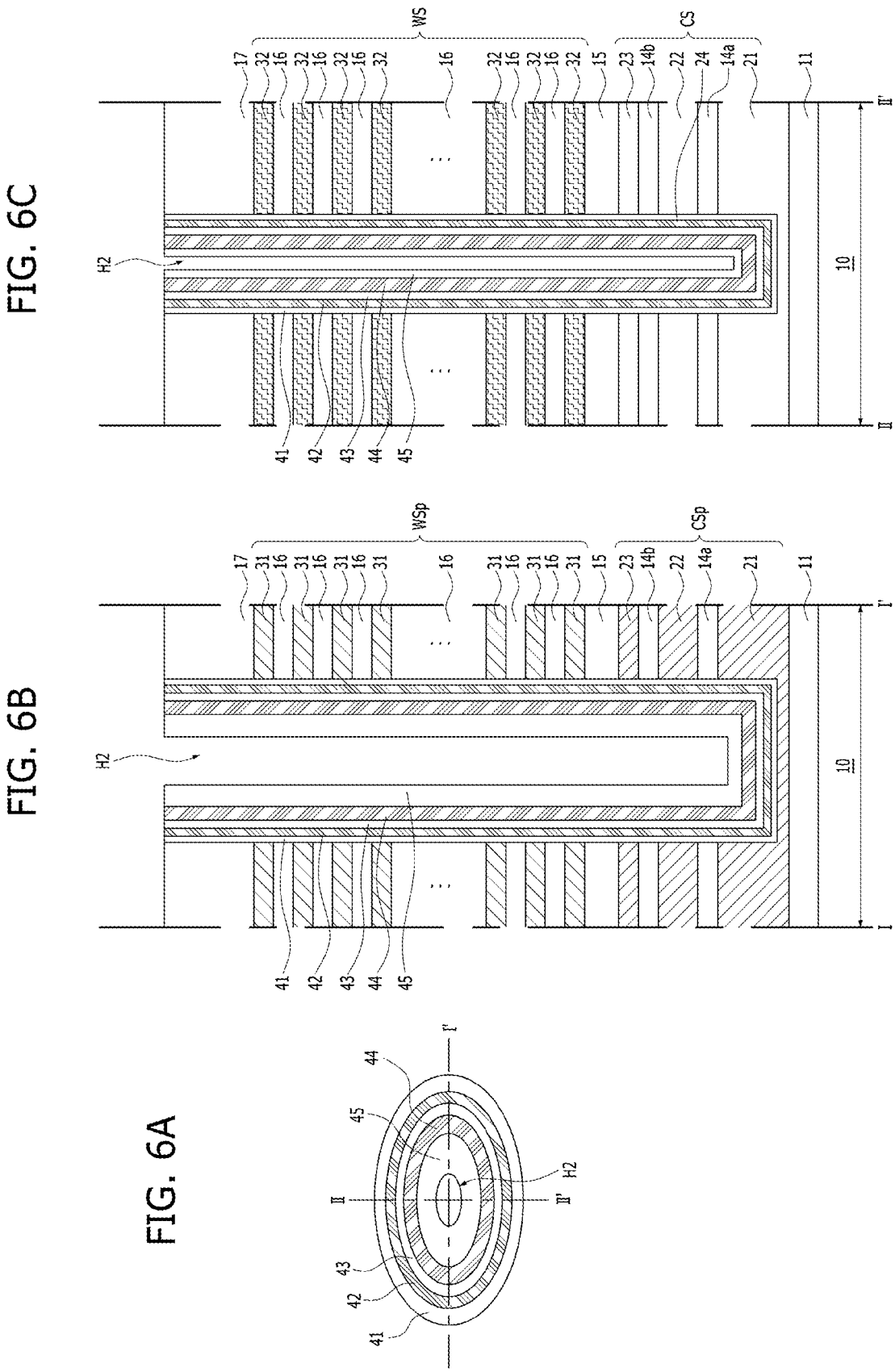

WSp { 17, 31, 16, 31, 16, 31, 16, 31, 16, 31, 16, 31, 15 }
CSp { 23, 14b, 22, 14a, 21 }
11
10

THREE DIMENSIONAL SEMICONDUCTOR DEVICE HAVING A BACK-GATE ELECTRODE

The present application claims priority under 35 U.S.C. § 119 to Korean Patent Application No. 10-2022-0097860, filed on Aug. 5, 2022 in the Korean Intellectual Property Office, which is incorporated herein by reference in its entirety.

BACKGROUND

1. Field

Embodiments of the present disclosure provide three dimensional semiconductor devices.

2. Description of the Related Art

Reducing the thickness of stacked material layers of a three dimensional semiconductor device has emerged as an important problem to be solved. As material layers become thinner, an operating voltage of the three dimensional semiconductor device must be lowered, but it is difficult to properly operate memory cells of the three dimensional semiconductor device with a low operating voltage.

SUMMARY

An embodiment of the present disclosure provides a memory cell structure of a three dimensional semiconductor device in which the memory cell can properly operate even at a low voltage.

An embodiment of the present disclosure provides a memory cell structure of a three dimensional semiconductor device having a back gate electrode.

An embodiment of the present disclosure provides a method of manufacturing a three dimensional semiconductor device having a back gate electrode.

A tree dimensional semiconductor device in accordance with an embodiment of the present disclosure may include a word line stack over a substrate and a channel pillar structure passing through the word line stack in a vertical direction perpendicular to a top surface of the substrate. The channel pillar structure may include a channel structure. The channel structure may include a blocking layer, a trap layer, a tunneling layer, a channel layer, a filling layer, and a back gate electrode. The channel structure may have a pillar shape.

A three dimensional semiconductor device in accordance with an embodiment of the present disclosure may include a common source electrode stack over a substrate; a word line stack over the common source electrode stack; and a channel pillar structure passing through the word line stack and the common electrode stack in a vertical direction perpendicular to a top surface of the substrate. The channel pillar structure may include a channel structure and a pad structure over the channel structure. The channel structure may include a back gate electrode having a pillar shape; a filling layer surrounding a side surface of the back gate electrode; a channel layer surrounding a side surface of the filling layer; a tunneling layer surrounding a side surface of the channel layer; a trap layer surrounding a side surface of the tunneling layer; and a blocking layer surrounding a side surface of the trap layer. The pad structure may include a channel pad electrically connected to the channel layer; and a spacing pattern electrically insulating the channel pad from the back gate electrode.

A method of manufacturing a three dimensional semiconductor device in accordance with an embodiment of the present disclosure may include forming a preliminary common source electrode stack and a preliminary word line stack over a substrate; forming a channel structure passing through the preliminary word line stack and the preliminary common source electrode stack in a vertical direction perpendicular to a top surface of the substrate; and forming a pad structure over the channel structure. The forming the channel structure includes forming a channel hole, sequentially forming a blocking layer, a trap layer, a tunneling layer, and a channel layer formed on an inner wall and a bottom surface of the channel hole, forming a filling layer filling a remaining portion of the channel hole after forming the channel layer, forming an electrode hole extending in the filling layer in the vertical direction, forming a pillar-shaped back gate electrode by filling the electrode hole, and forming a spacing pattern, a channel pad, and a back gate electrode pad over the back gate electrode in the vertical direction.

A method of manufacturing a three dimensional semiconductor device in accordance with an embodiment of the present invention may include forming a back gate electrode layer over a substrate; forming a preliminary common source electrode stack over the back gate electrode layer; forming a preliminary word line stack over the preliminary common source electrode layer; forming a channel structure passing through the preliminary word line stack and the preliminary common source electrode stack in a vertical direction perpendicular to a top surface of the substrate; and forming a pad structure over the channel structure. The forming the channel structure may include forming a channel hole; sequentially forming a blocking layer, a trap layer, a tunneling layer, and a channel layer on an inner wall and a bottom surface of the channel hole; forming a filling layer filling the channel hole after forming the channel layer; forming an electrode hole extending in the filling layer in the vertical direction and passing through bottom surfaces of the filling layer, the channel layer, the tunneling layer, the trap layer, and the blocking layer; and forming a back gate electrode electrically connected to the back gate electrode layer in the electrode hole.

BRIEF DESCRIPTION OF THE DRAWINGS

FIG. 3 is a longitudinal cross-sectional view schematically illustrating a three-dimensional semiconductor device according to another embodiment of the present disclosure.

FIGS. 4A, 4B, and 4C to FIGS. 16A, 16B, and 16C are longitudinal cross-sectional views illustrating a method of manufacturing a three dimensional semiconductor device according to an embodiment of the present disclosure.

DETAILED DESCRIPTION

Figures 1A, 1B:
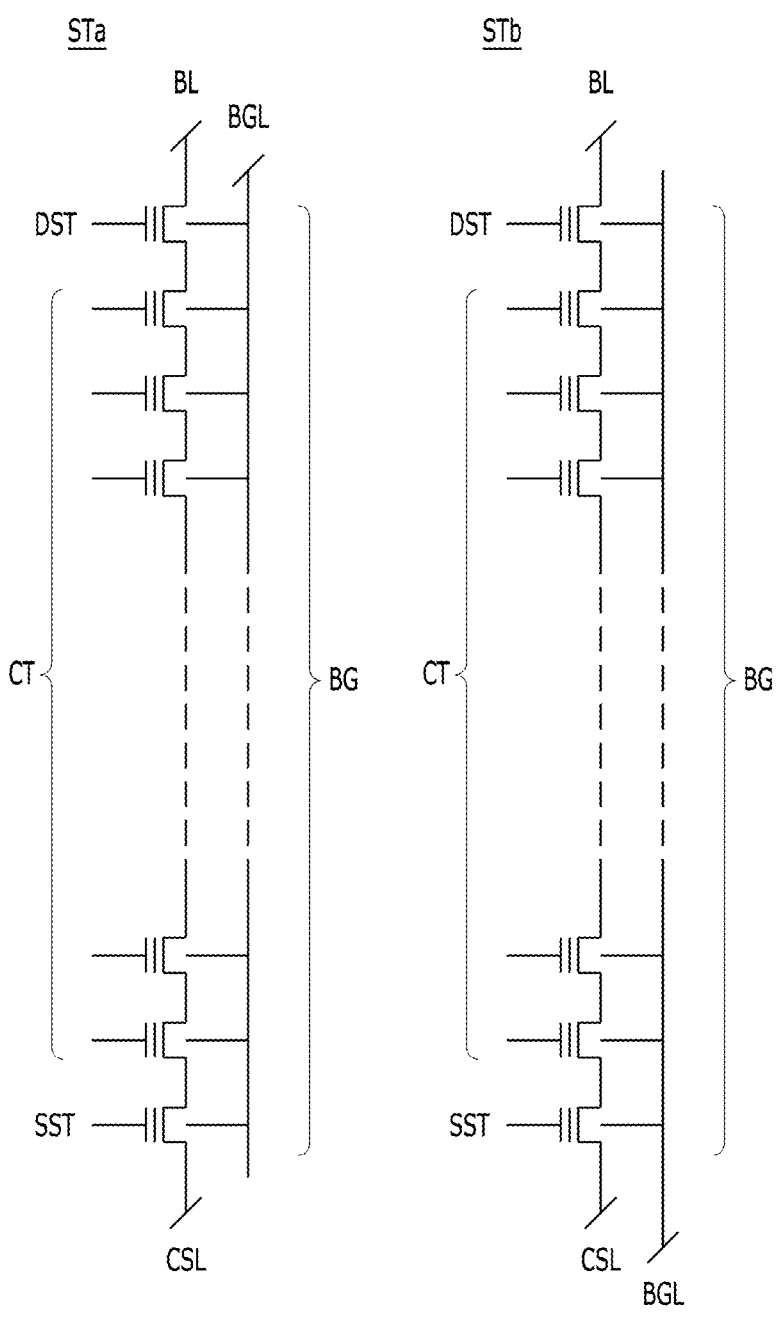
FIGS. 1A and 1B are circuit diagrams schematically illustrating unit strings of three dimensional semiconductor devices according to embodiments of the present disclosure.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It will be understood that, although the terms "first" and/or "second" may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

Other expressions that explain the relationship between elements, such as "between", "directly between", "adjacent to" or "directly adjacent to" should be construed in the same way.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIGS. 1A and 1B are circuit diagrams schematically illustrating unit strings STa and STb of three dimensional semiconductor devices according to embodiments of the present disclosure. Referring to FIGS. 1A and 1B, each of the unit strings STa and STb may include a drain selection transistor DST, a plurality of cell transistors CT, and a source selection transistor SST that are connected in series. With respect to the orientation of FIGS. 1A and 1B, the drain select transistor DST is disposed at the uppermost position of each of the unit strings STa and STb and may be connected to a bit line BL, and the source select transistor SST is disposed at the lowermost position of each of the unit strings STa and STb may be connected to a common source line CSL. Each of the unit strings STa and STb may further include a back gate electrode BG to apply a back bias to the transistors DST, CT, and SST. One end of the back gate electrode BG may be connected to a back gate line BGL, and the other end of the back gate electrode BG may be floated.

Referring to FIG. 1A, the back gate electrode BG may be connected to the back gate line BGL located at an upper portion of the unit string STa. Referring to FIG. 1B, the back gate electrode BG may be connected to the back gate line BGL located at a lower portion of the unit string STb.

Figure 2A:
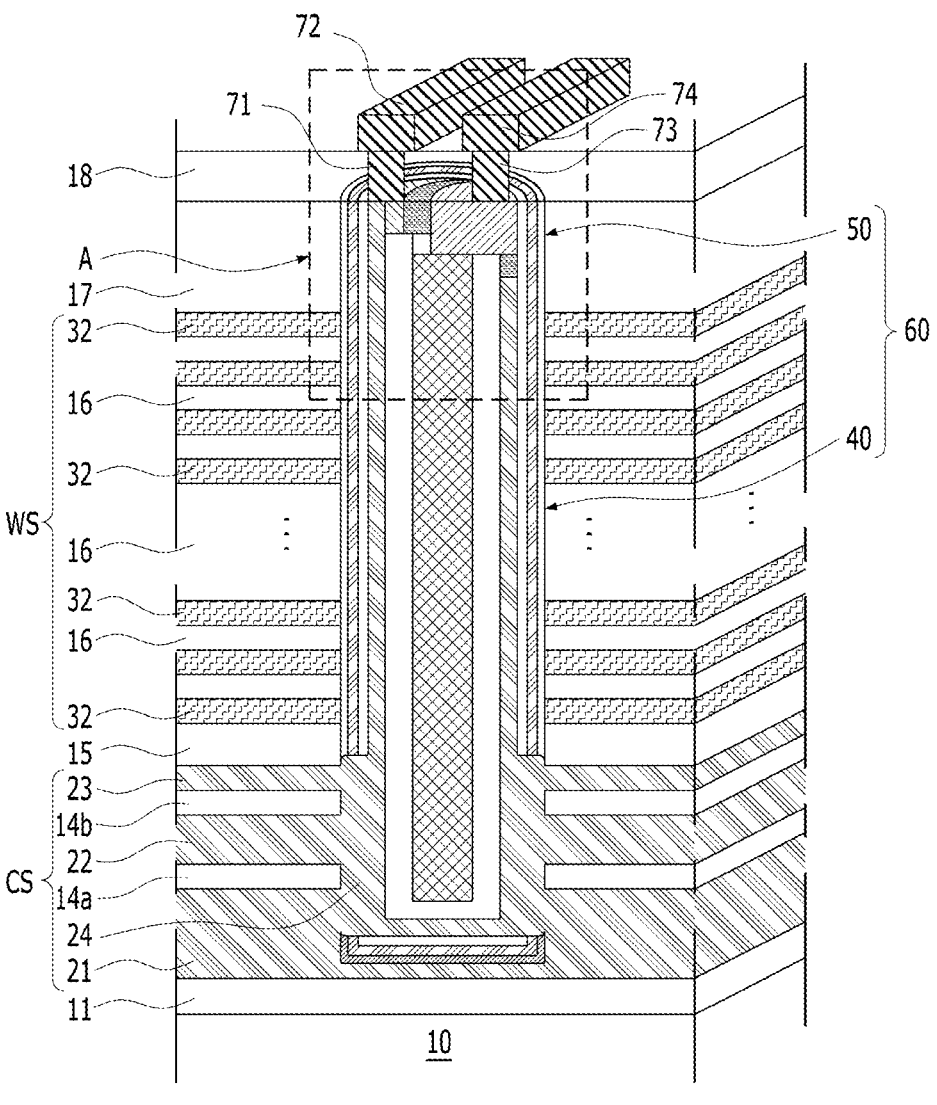
FIG. 2A is a perspective cross-sectional view schematically illustrating a three dimensional semiconductor device according to an embodiment of the present disclosure.
Figure 2B:
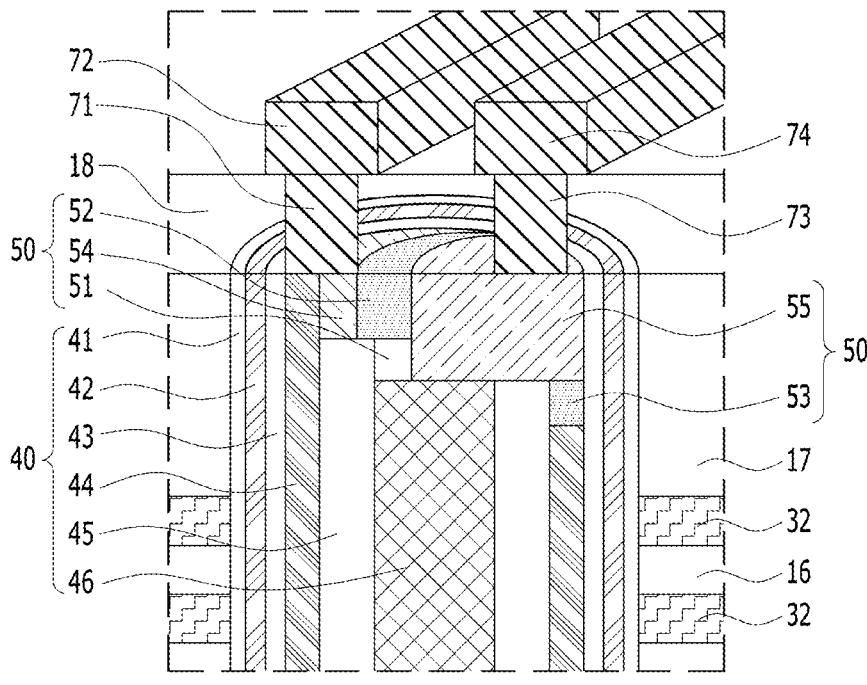
FIG. 2B is an enlarged view of an area A of FIG. 2A.

FIG. 2A is a perspective cross-sectional view schematically illustrating a three dimensional semiconductor device according to an embodiment of the present disclosure, and FIG. 2B is an enlarged view of an area A of FIG. 2A.

Referring to FIGS. 2A and 2B, the three dimensional semiconductor device may include a lower insulating layer 11, a common source electrode stack CS, an intermediate insulating layer 15, a word line stack WS, an upper insulating layer 17, a channel pillar structure 60, a capping insulating layer 18, a channel contact 71, a back gate electrode contact 73, a bit line 72, and a back gate electrode interconnection 74 on a substrate 10. These components of the three dimensional semiconductor device may be stacked on the substrate 10 in a vertical direction perpendicular to a top surface of the substrate 10.

The common source electrode stack CS may be formed on the lower insulating layer 11. The intermediate insulating layer 15 may be formed on the common source electrode stack CS. The word line stack WS may be formed on the intermediate insulating layer 15. The upper insulating layer 17 may be formed on the word line stack WS. The channel pillar structure 60 may pass through the upper insulating layer 17, the word line stack WS, and the intermediate insulating layer 15 to be electrically connected to the common source electrode stack CS in the vertical direction.

The capping insulating layer 18 may be formed on the channel pillar structure 60 and the upper insulating layer 17. The channel contact 71 and the back gate electrode contact 73 may vertically pass through the capping insulating layer 18 to be electrically connected to the channel pillar structure 60. The bit line 72 and the back gate electrode interconnection 74 may be formed on the capping insulating layer 18, the channel contact 71, and the back gate electrode contact 73 to be electrically connected to the channel contact 71 and the back gate electrode contact 73, respectively.

The substrate 10 may include a semiconductor layer. For example, the substrate 10 may include a silicon wafer. In one embodiment, the substrate 10 may include an epitaxially grown silicon layer or an epitaxially grown silicon germanium layer. In one embodiment, the substrate 10 may include a logic circuit layer.

The lower insulating layer 11 may be formed between the substrate 10 and the common source electrode stack CS. The lower insulating layer 11 may electrically insulate the common source electrode stack CS from the substrate 10. The lower insulating layer 11 may include at least one insulating material layer such as a silicon oxide based material layer, a silicon nitride based material layer, another insulating material layer, or a combination thereof.

The common source electrode stack CS may include a lower source electrode layer 21, an intermediate source electrode layer 22, an upper source electrode layer 23, and a source electrode connection part 24. The common source electrode stack CS may further include a lower electrode insulating layer 14a between the lower source electrode layer 21 and the intermediate source electrode layer 22, and an upper electrode insulating layer 14b between the intermediate source electrode layer 22 and the upper source electrode layer 23.

The lower source electrode layer 21, the intermediate source electrode layer 22, and the upper source electrode layer 23 may each extend in a horizontal direction parallel to the top surface of the substate 10 and be stacked in the vertical direction. The lower source electrode layer 21, the intermediate source electrode layer 22, and the upper source electrode layer 23 may each have a plate shape.

The source electrode connection part 24 may have a ring shape. The source electrode connection part 24 may electrically, physically, and materially connect the lower source electrode layer 21, the intermediate source electrode layer 22, and the upper source electrode layer 23 to each other.

The lower source electrode layer 21, the intermediate source electrode layer 22, the upper source electrode layer 23, and the source electrode connection part 24 may be formed of the same material to be materially continued with each other. In one embodiment, at least one of the lower source electrode layer 21, the intermediate source electrode layer 22, and the upper source electrode layer 23 may be omitted.

Each of the lower source electrode layer 21, the intermediate source electrode layer 22, and the upper source electrode layer 23 may include a conductive layer such as an N-type ion-doped silicon layer, a metal silicide layer, a metal compound layer, or a metal layer. Each of the lower and the upper electrode insulating layers 14a and 14b may include at least one insulating material layer such as a silicon oxide based layer, a silicon nitride based layer, another insulating material layer, or a combination thereof.

The intermediate insulating layer 15 may be formed between the common source electrode stack CS and the word line stack WS. The intermediate insulating layer 15 may electrically insulate the common source electrode stack CS from the word line stack WS. The intermediate insulating layer 15 may include at least one insulating layer such as a silicon oxide based material layer, a silicon nitride based material layers, another insulating material layer, or a combination thereof.

The word line stack WS may include interlayer insulating layers 16 and word lines 32 that are alternately stacked in the vertical direction. Each of the interlayer insulating layers 16 may be formed between two word lines 32 to electrically insulate the two word lines 32 from each other. Each of the interlayer insulating layers 16 may include an insulating layer such as a silicon oxide based material layer. The word lines 32 may include a conductive material such as a metal or a metal compound, and may extend in the horizontal direction.

The channel pillar structure 60 may include a channel structure 40 and a pad structure 50. The channel structure 40 may have a pillar shape vertically passing through the word lines 32 and the interlayer insulating layers 16 to be in contact with the common source electrode stack CS.

Referring to FIG. 2B, the channel structure 40 may include a blocking layer 41, a trap layer 42, a tunneling layer 43, a channel layer 44, a filling layer 45, and a back gate electrode 46. The back gate electrode 46 may have a pillar shape. The channel layer 44 may be electrically connected to the source electrode layers 21, 22, and 23 through the source electrode connection part 24. The back gate electrode 46 may include a conductive material such as an N-type ion-doped silicon, a metal silicide, a metal alloy, a metal compound, or a metal.

The filling layer 45 may have a cylindrical shape surrounding a bottom surface and side surfaces of the back gate electrode 46. The filling layer 45 may include an insulating material such as a silicon oxide based material. The channel layer 44 may have a cylindrical shape surrounding a bottom surface and outer side surfaces of the filling layer 45. The channel layer 44 may include an intrinsic semiconductor material or a doped silicon.

The tunneling layer 43 may have a cylindrical shape surrounding a bottom surface and outer side surfaces of the channel layer 44. The tunneling layer 43 may include an insulating material such as a silicon oxide based material. The trap layer 42 may surround a bottom surface and outer side surfaces of the tunneling layer 43. The trap layer 42 may include an insulating material such as a high-k dielectric material or a silicon nitride. The blocking layer 41 may surround a bottom surface and outer side surfaces of the trap layer 42. The blocking layer 41 may include an insulating material having a high work function, such as a metal oxide.

The source electrode connection part 24 of the common source electrode stack CS may horizontally pass through the blocking layer 41, the trap layer 42, the tunneling layer 43, and the channel layer 44 to be in contact with the outer side surfaces of the filling layer 45.

The pad structure 50 may include a lower spacing pattern 51, an upper spacing pattern 52, a buried spacing pattern 53, a channel pad 54, and a back gate electrode pad 55. The lower spacing pattern 51 and the upper spacing pattern 52 may partially surround an outer surface of the back gate electrode pad 55 in a liner shape. The lower spacing pattern 51 may be formed in a liner shape between an inner surface of the filling layer 45 and the outer surface of the back gate electrode pad 55. The upper spacing pattern 52 may be formed in a liner shape between an inner surface of the channel pad 54 and the outer surface of the back gate electrode pad 55 to electrically insulate the back gate electrode pad 55 from the channel pad 54.

A horizontal thickness of the lower spacing pattern 51 may be smaller than a horizontal thickness of the upper spacing pattern 52. The buried spacing pattern 53 may be formed between an upper end of a recessed portion of the channel layer 44 and a bottom surface of the back gate electrode pad 55 in the vertical direction to electrically insulate the back gate electrode pad 55 from the channel layer 44. The lower spacing pattern 51 may include a silicon oxide based material. The upper spacing pattern 52 and the buried spacing pattern 53 may include oxidized silicon. In one embodiment, the upper spacing pattern 52 and the buried spacing pattern 53 may further include a silicon oxide.

The channel pad 54 may be formed in a liner shape on a non-recessed portion of the channel layer 44. The channel pad 54 may be in contact with the channel layer 44. The channel pad 54 may include a conductive material such as an N-type ion-doped silicon, a metal silicide, a metal alloy, a metal compound, or a metal.

The back gate electrode pad 55 may be surrounded by the tunneling layer 43, the lower spacing pattern 51, and the upper spacing pattern 52. A bottom surface of the back gate electrode pad 55 may be in contact with an upper end of the back gate electrode 46, an upper end of a recessed portion of the filling layer 45, and an upper end of the buried spacing pattern 53. The back gate electrode pad 55 may be electrically connected to the back gate electrode 46. The back gate electrode pad 55 may have a mesa-type disk shape. In a top view, the back gate electrode pad 55 may have an offset and eccentric shape with respect to the channel structure 40. The back gate electrode pad 55 may include a conductive material such as an N-type ion-doped silicon, a metal silicide, a metal alloy, a metal compound, or a metal.

In the top view, the lower spacing pattern 51, the upper spacing pattern 52, the channel pad 54, and the buried spacing pattern 53 may have a half ring shape. In the top view, a combination of the upper spacing pattern 52 and the buried spacing pattern 53 may have a ring shape. In the top view, the back gate electrode pad 55 may have a circular shape.

The upper insulating layer 17 may be formed on the word line stack WS to surround an upper portion of the channel pillar structure 60. That is, the upper insulating layer 17 may be formed on an upper portion of a side surface of the channel structure 40. The upper insulating layer 17 may include at least one insulating material such as a silicon oxide, a silicon nitride, or another insulating material, or a combination thereof.

The channel contact 71 may be in contact with the channel pad 54, so that it is electrically connected to the channel layer 44 and the channel pad 54. The channel contact 71 may electrically connect the channel layer 44 and the channel pad 54 to the bit line 72. The channel contact 71 may include a conductive material such as an N-type ion-doped silicon, a metal silicide, a metal alloy, a metal compound, or a metal. The bit line 72 may include a metal.

The back gate electrode contact 73 may be in contact with the back gate electrode pad 55. The back gate electrode contact 73 may electrically connect the back gate electrode pad 55 to the back gate electrode interconnection 74.

The back gate electrode contact 73 may include a conductive material such as an N-type ion-doped silicon, a metal silicide, a metal alloy, a metal compound, or a metal. The back gate electrode interconnection 74 may include a metal.

The capping insulating layer 18 may be formed on the upper insulating layer 17. The capping insulating layer 18 may include a silicon oxide, a silicon nitride, or a combination thereof. The capping insulating layer 18 may surround side surfaces of the channel contact 71 and the back gate electrode contact 73. Accordingly, the channel contact 71 and the back gate electrode contact 73 may vertically pass through the capping insulating layer 18. The bit line 72 and the back gate electrode interconnection 74 may be formed on the capping insulating layer 18.

Referring to FIGS. 1A, 2A, and 2B, the word lines 32 may correspond to the drain select transistor DST, the cell transistors CT, and the source select transistor SST. The back gate electrode 46 may correspond to the back gate electrode BG. The common source electrode stack CS may correspond to the common source line CSL. The back gate electrode interconnection 74 may correspond to the back gate line BGL.

Figure 3:
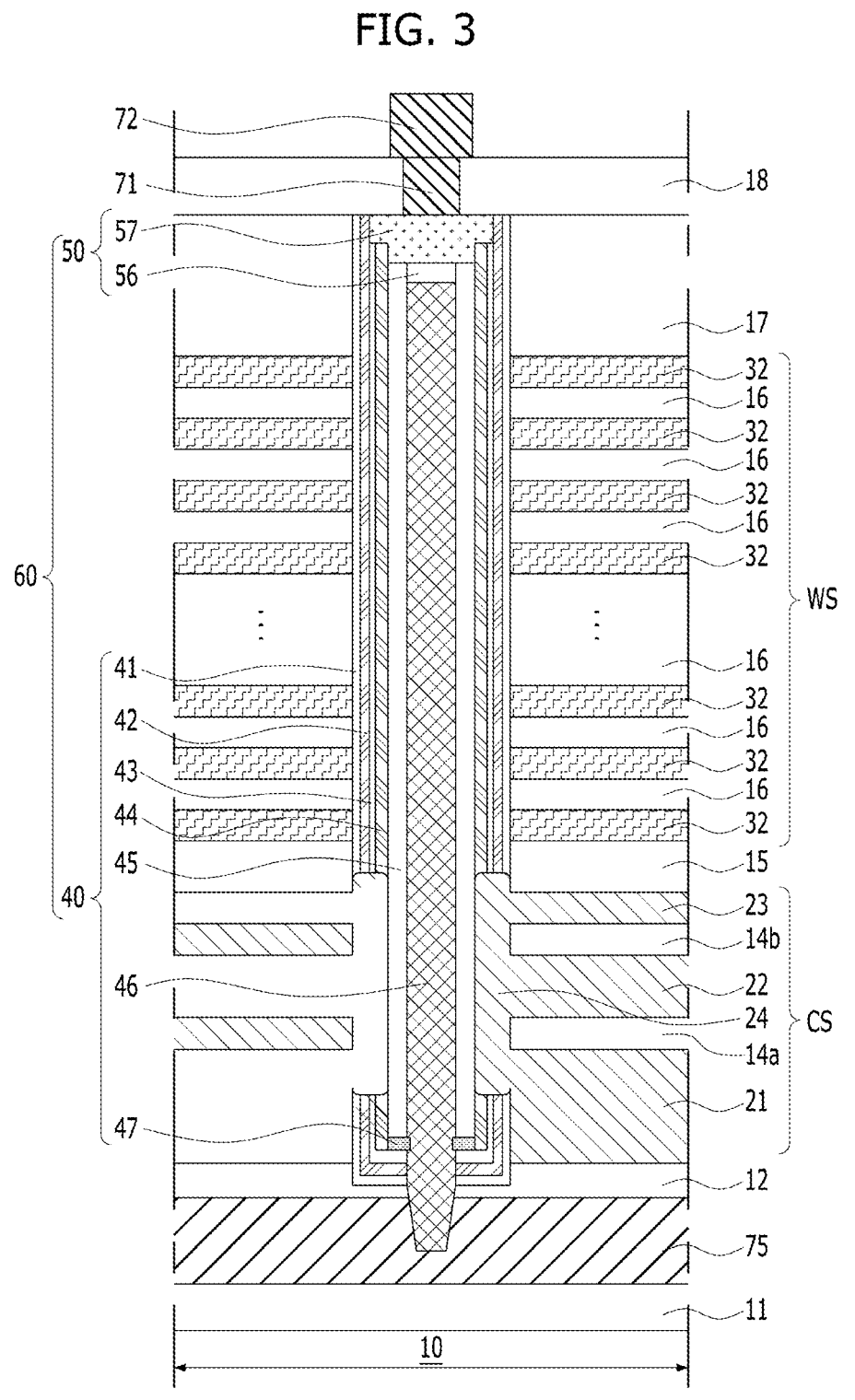

FIG. 3 is a longitudinal cross-sectional view schematically illustrating a three-dimensional semiconductor device according to another embodiment of the present disclosure. Referring to FIG. 3, the three dimensional semiconductor device may include a lower insulating layer 11, a back gate electrode layer 75, a buffer insulating layer 12, a common source electrode stack CS, an intermediate insulating layer 15, a word line stack WS, an upper insulating layer 17, a capping insulating layer 18, a channel pillar structure 60, a channel contact 71, and a bit line 72 on a substrate 10. These components of the three dimensional semiconductor device may be stacked on the substrate 10 in a vertical direction perpendicular to a top surface of the substrate 10.

The back gate electrode layer 75 may be formed on the lower insulating layer 11. The back gate electrode layer 75 may include a doped silicon. The back gate electrode layer 75 may have a plate shape. The buffer insulating layer 12 may be formed on the back gate electrode layer 75. The buffer insulating layer 12 may include an insulating material such as a silicon oxide based material.

The common source electrode stack CS may be formed on the buffer insulating layer 12. The intermediate insulating layer 15 may be formed on the common source electrode stack CS.

The channel pillar structure 60 may vertically pass through the upper insulating layer 17, the word line stack WS, the intermediate insulating layer 15, the common source electrode stack CS, and the buffer insulating layer 12. The channel pillar structure 60 may include a channel structure 40 and a pad structure 50.

The channel structure 40 may include a blocking layer 41, a trap layer 42, a tunneling layer 43, a channel layer 44, a filling layer 45, a back gate electrode 46, and an electrode spacing pattern 47. The back gate electrode 46 may vertically pass through bottom surfaces of the filling layer 45, the channel layer 44, the tunneling layer 43, the trap layer 42, and the blocking layer 41, and the buffer insulating layer 12 to be connected to the back gate electrode layer 75.

The electrode spacing pattern 47 may be formed between the tunneling layer 43 and the filling layer 45 at the bottom of the channel pillar structure 60. The electrode spacing pattern 47 may be formed between a sidewall of the back gate electrode 46 and a side end of the bottom of the channel layer 44 at the bottom of the channel pillar structure 60. The electrode spacing pattern 47 may have a ring shape surrounding side surfaces of the back gate electrode 46. The electrode spacing pattern 47 may include oxidized silicon. For example, the electrode spacing pattern 47 may be formed by oxidizing a portion of the channel layer 44 that is between the filling layer 45 and the tunneling layer 43 in the vertical direction at the bottom of the channel pillar structure 60. The electrode spacing pattern 47 may electrically insulate the back gate electrode 46 from the channel layer 44.

The pad structure 50 may include a pad spacing pattern 56 and a channel pad 57. The pad spacing pattern 56 may be formed between an upper surface of the back gate electrode 46 and a bottom surface of the channel pad 57. The pad spacing pattern 56 may have a disk shape surrounded by the filling layer 45. The pad spacing pattern 56 may include an insulating material such as a silicon oxide based material.

The channel pad 57 may be formed on the pad spacing pattern 56 to have a lid shape. The channel pad 57 may be connected to the channel layer 44. The channel pad 57 may include a conductive material such as an N-type ion-doped silicon, a metal silicide, a metal alloy, a metal compound, or a metal. Upper surfaces of the channel pad 57 and the upper insulating layer 17 may be co-planar.

Referring to FIGS. 1B and 3, the word lines 32 may correspond to the drain select transistor DST, the cell transistors CT, and the source select transistor SST. The back gate electrode 46 may correspond to the back gate electrode BG. The common source electrode stack CS may correspond to the common source line CSL. The back gate electrode layer 75 may correspond to the back gate line BGL.

FIGS. 4A, 4B, and 4C to FIGS. 16A, 16B, and 16C are views illustrating a method of manufacturing a three dimensional semiconductor device according to an embodiment of the present disclosure. FIGS. 4A to 16A are top views of a channel pillar structure 60 of the three-dimensional semiconductor device, and FIGS. 4B to 16B are longitudinal cross-sectional views taken along a line I-I' of FIGS. 4A to 16A, respectively, and FIG. 4C to FIG. 16C are longitudinal cross-sectional views taken along a line II-II' of FIGS. 4A to 16A, respectively. The three dimensional semiconductor device of this embodiment corresponds to the three dimensional semiconductor device illustrated in FIG. 2A.

Figures 4A, 4B, 4C:
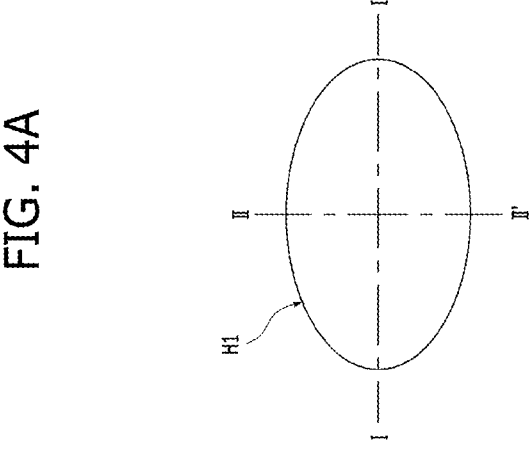

Referring to FIGS. 4A to 4C, the method of manufacturing the three dimensional semiconductor device may include forming a lower insulating layer 11 on a substrate 10, forming a preliminary common source electrode stack CSp on the lower insulating layer 11, forming an intermediate insulating layer 15 on the preliminary common source electrode stack CSp, forming a preliminary word line stack WSp on the intermediate insulating layer 15, forming an upper insulating layer 17 on the preliminary word line stack WSp, and forming a channel hole H1. The channel hole H1 may have an oval shape when viewed in the plan view of FIG. 4A.

The forming of the preliminary common source electrode stack CSp may include depositing a lower source electrode layer 21, a lower electrode insulating layer 14a, an intermediate source electrode layer 22, and an upper electrode insulating layer 14b, an upper source electrode layers 23 to be sequentially stacked on the lower insulating layer 11 in a vertical direction perpendicular to a top surface of the substrate 10. The lower insulating layer 11, the lower and the upper electrode insulating layers 14a and 14b, the intermediate insulating layer 15, and the upper insulating layer 17 may include an insulating material such as a silicon oxide based material. The lower source electrode layer 21, the intermediate source electrode layer 22, and the upper source electrode layer 23 may include an N-type ion-doped silicon.

The forming of the preliminary word line stack WSp may include alternately depositing interlayer insulating layers 16 and sacrificial insulating layers 31 on the intermediate insulating layer 15 in the vertical direction. The interlayer insulating layers 16 may include an insulating material such as a silicon oxide based material. The sacrificial insulating layers 31 may include an insulating material such as a silicon nitride based material having an etch selectivity with respect to the interlayer insulating layers 16.

The channel hole H1 may vertically penetrate the upper insulating layer 17, the preliminary word line stack WSp, the intermediate insulating layer 15, and the preliminary common source electrode stack CSp. The channel hole H1 may not completely penetrate the lower source electrode layer 21. A bottom surface of the channel hole H1 may be located in the lower source electrode layer 21. In another embodiment, the channel hole H1 may completely penetrate the lower source electrode layer 21, and thus the bottom surface of the channel hole H1 may be located in the lower insulating layer 11.

Figures 5A, 5B, 5C:
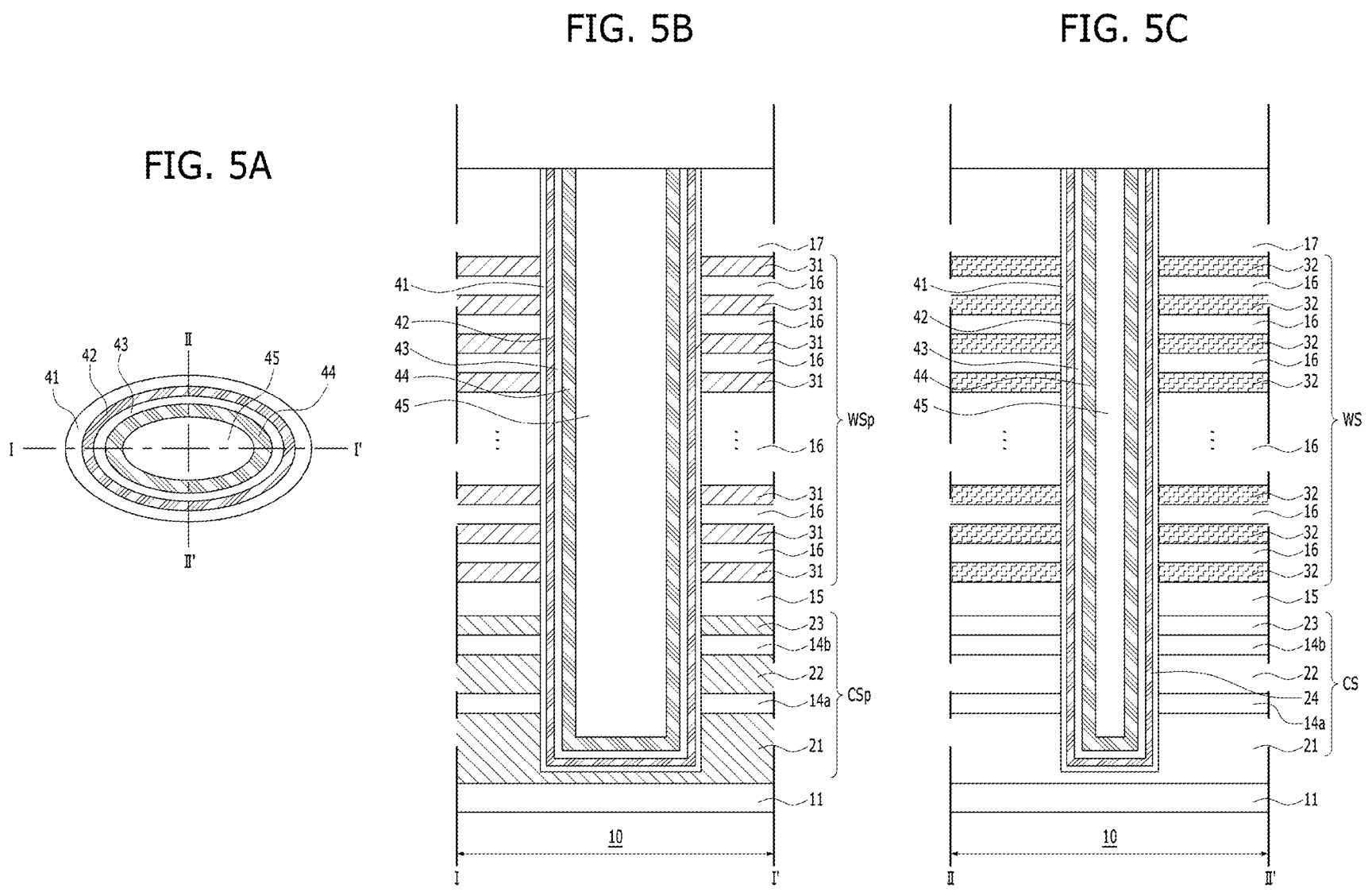

Referring to FIGS. 5A to 5C, the method may further include sequentially depositing a blocking layer 41, a trap layer 42, a tunneling layer 43, a channel layer 44, and a filling layer 45 in the channel hole H1. The blocking layer 41 may be conformally formed on the bottom surface and sidewalls of the channel hole H1. The blocking layer 41 may include an insulating material having a high work function, such as a metal oxide. The trap layer 42 may be conformally formed on a bottom surface and inner walls of the blocking layer 41. The trap layer 42 may include a high-k material or an insulating material such as a silicon nitride. The tunneling layer 43 may be conformally formed on a bottom surface and inner walls of the trap layer 42. The tunneling layer 43 may include a silicon oxide based material. The channel layer 44 may be conformally formed on a bottom surface and inner walls of the tunneling layer 43. The channel layer 44 may include an intrinsic semiconductor material or an N-type ion-doped silicon.

The filling layer 45 may be formed in a pillar shape to fill the remaining portion of the channel hole H1 after the channel layer 44 is formed. The filling layer 45 may include an insulating material such as a silicon oxide. In one embodiment, the method may further include co-planarizing upper surfaces of the upper insulating layer 17, the blocking layer 41, the trap layer 42, the tunneling layer 43, the channel layer 44, and the filling layer 45 by performing a planarization process such as a chemical mechanical polishing (CMP) process. Each of the blocking layer 41, the trap layer 42, the tunneling layer 43, and the channel layer 44 may have a cylindrical shape, and the filling layer 45 may have a pillar shape.

Referring to FIGS. 6A to 6C, the method may further include forming an electrode hole H2 penetrating and extending vertically along a center line of the filling layer 45 having the pillar shape by performing an etching process. The electrode hole H2 may have an oval shape when viewed in the plan view of FIG. 6A. The channel hole H1 and the electrode hole H2 may share a center in the plan view. The filling layer 45 may be exposed on a bottom surface and sidewalls of the electrode hole H2. The filling layer 45 may remain on the bottom surface and the inner walls of channel layer 44. That is, the filling layer 45 may have a cylindrical shape.

Figures 7A, 7B, 7C:
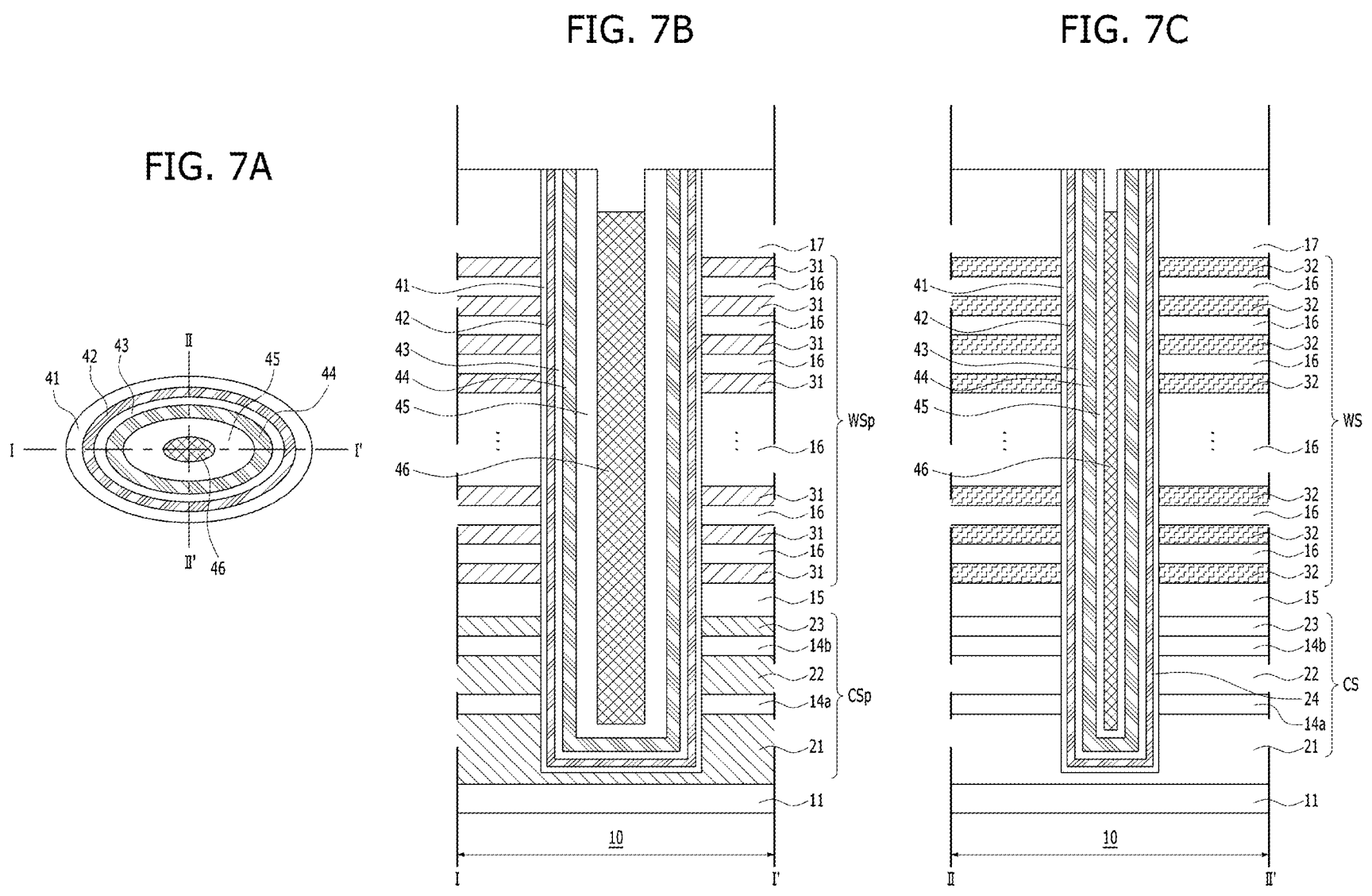

Referring to FIGS. 7A to 7C, the method may further include forming a back gate electrode 46 by partially filling the electrode hole H2 with a conductive material in the vertical direction. An upper surface of the back gate electrode 46 may be lower than the upper surface of the upper insulating layer 17 to expose an inner wall of an upper portion of the filling layer 45. That is, the method may include performing a deposition process and an etch-back process to form the back gate electrode 46. The back gate electrode 46 may include a conductive material such as an N-type ion-doped silicon.

Figures 8A, 8B, 8C:
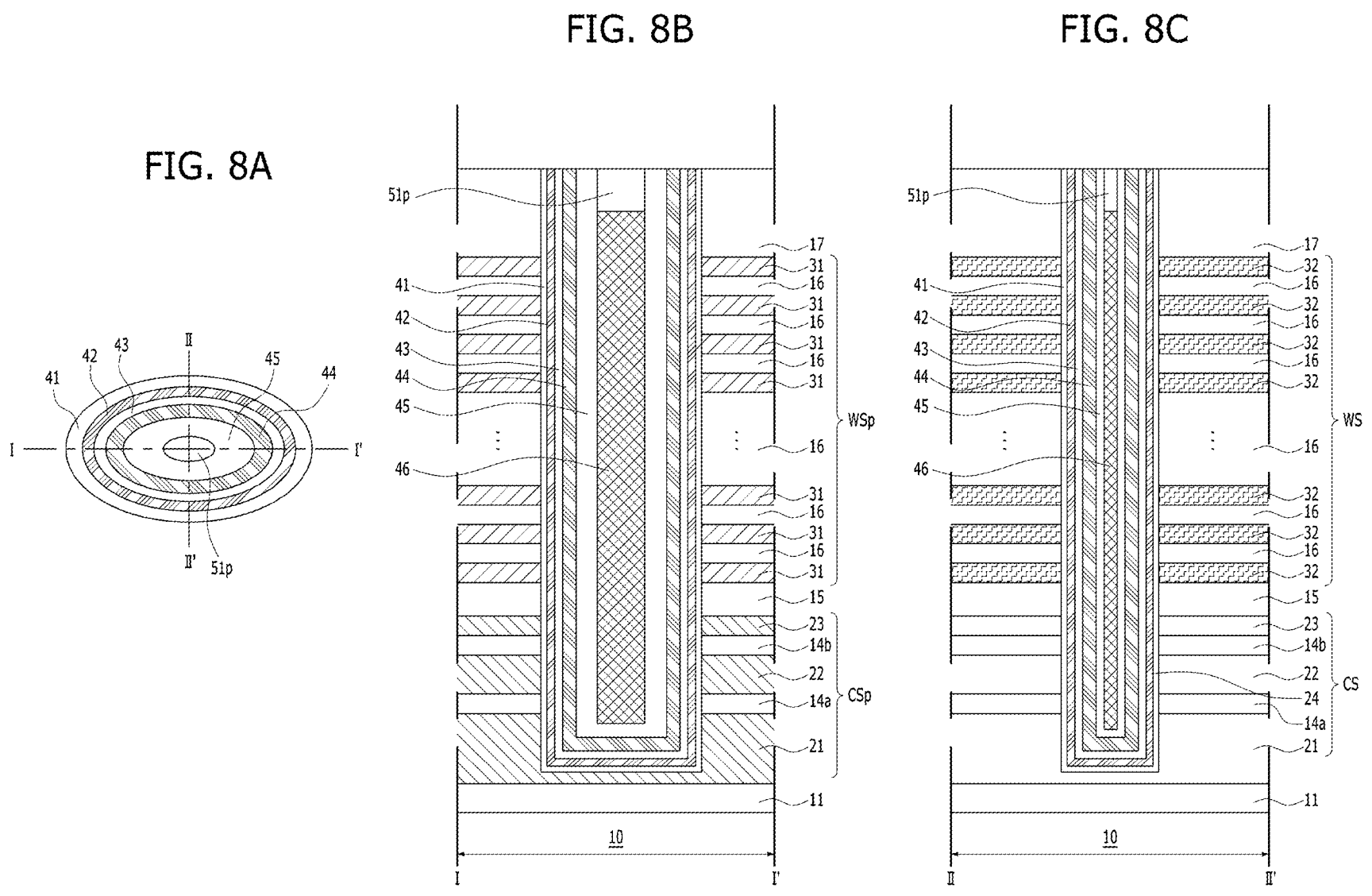

Referring to FIGS. 8A to 8C, the method may further include depositing a preliminary lower spacing pattern 51p on the back gate electrode 46 to fill the remaining portion of the electrode hole H2 after the back gate electrode 46 is formed. A side surface of the preliminary lower spacing pattern 51p may be in contact with the exposed inner wall of the upper portion of the filling layer 45. The preliminary lower spacing pattern 51p may include an insulating material such as a silicon oxide based material. In one embodiment, the method may further include co-planarizing upper surfaces of the upper insulating layer 17 and the preliminary lower spacing pattern 51p by performing a CMP process.

Figures 9A, 9B, 9C:
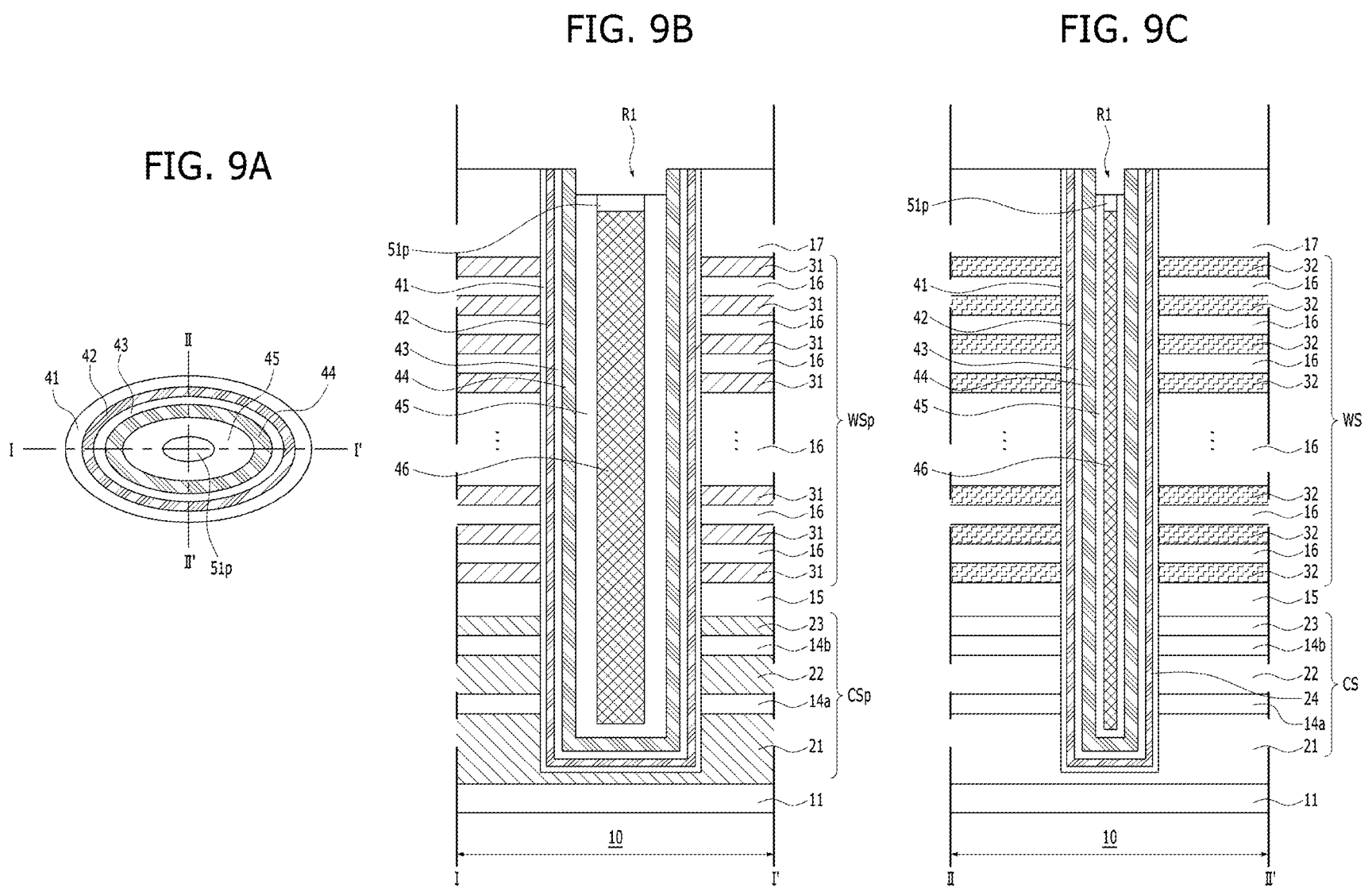

Referring to FIGS. 9A to 9C, the method may further include partially removing the preliminary lower spacing pattern 51p and the filling layer 45 to form a first recess R1. An inner surface of an upper end of the channel layer 44 may be exposed in the first recess R1.

Figures 10A, 10B, 10C:
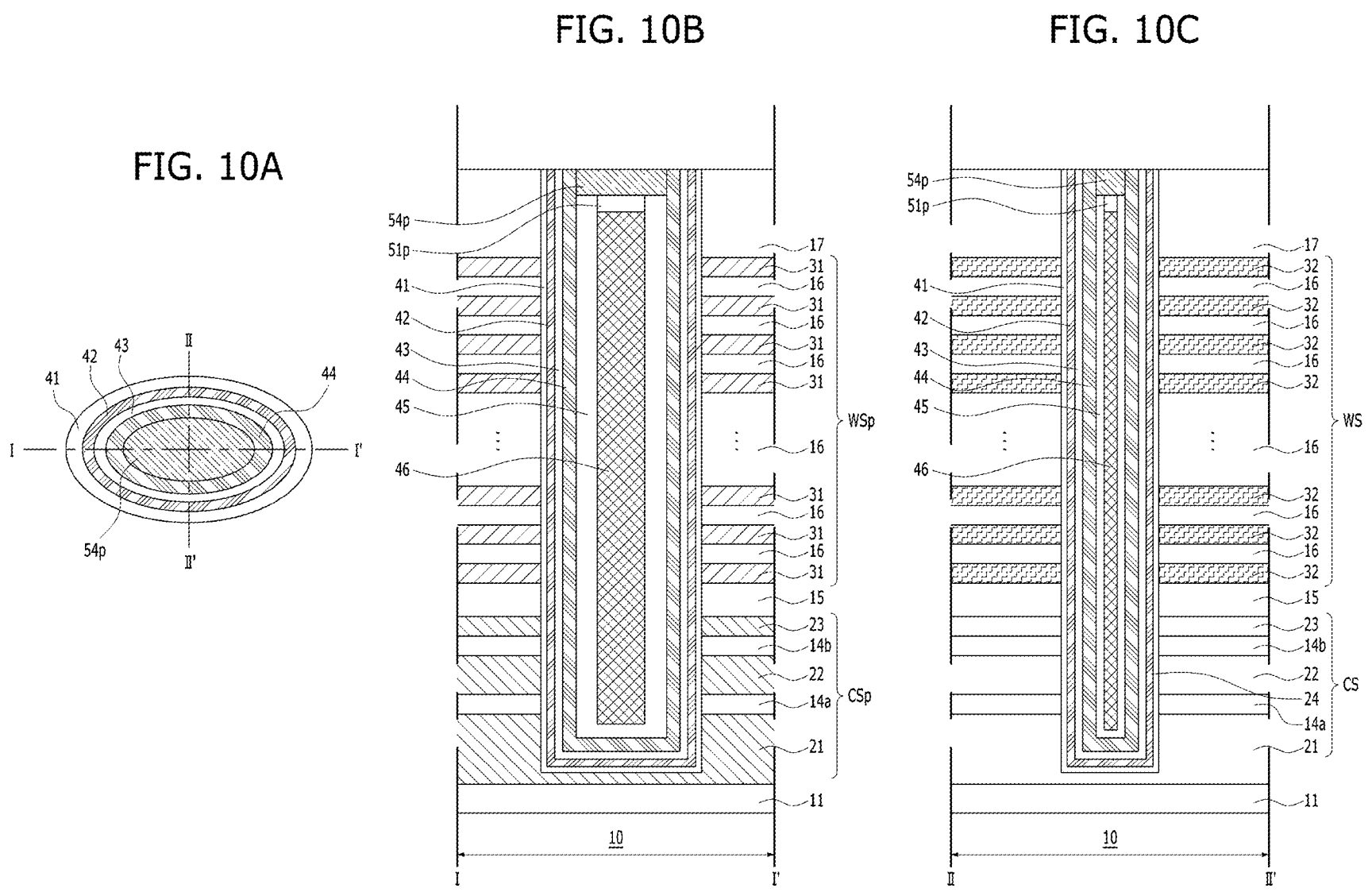

Referring to FIGS. 10A to 10C, the method may further include forming a preliminary channel pad 54p in the first recess R1 by performing a deposition process. The preliminary channel pad 54p may be in contact with the exposed inner surface of the upper end of the channel layer 44. The preliminary channel pad 54p may include a conductive material such as an N-type ion-doped silicon, a metal silicide, a metal alloy, a metal compound, or a metal. In one embodiment, the method may further include co-planarizing upper surfaces of the upper insulating layer 17 and the preliminary channel pad 54p by performing a CMP process.

Figures 11A, 11B, 11C:
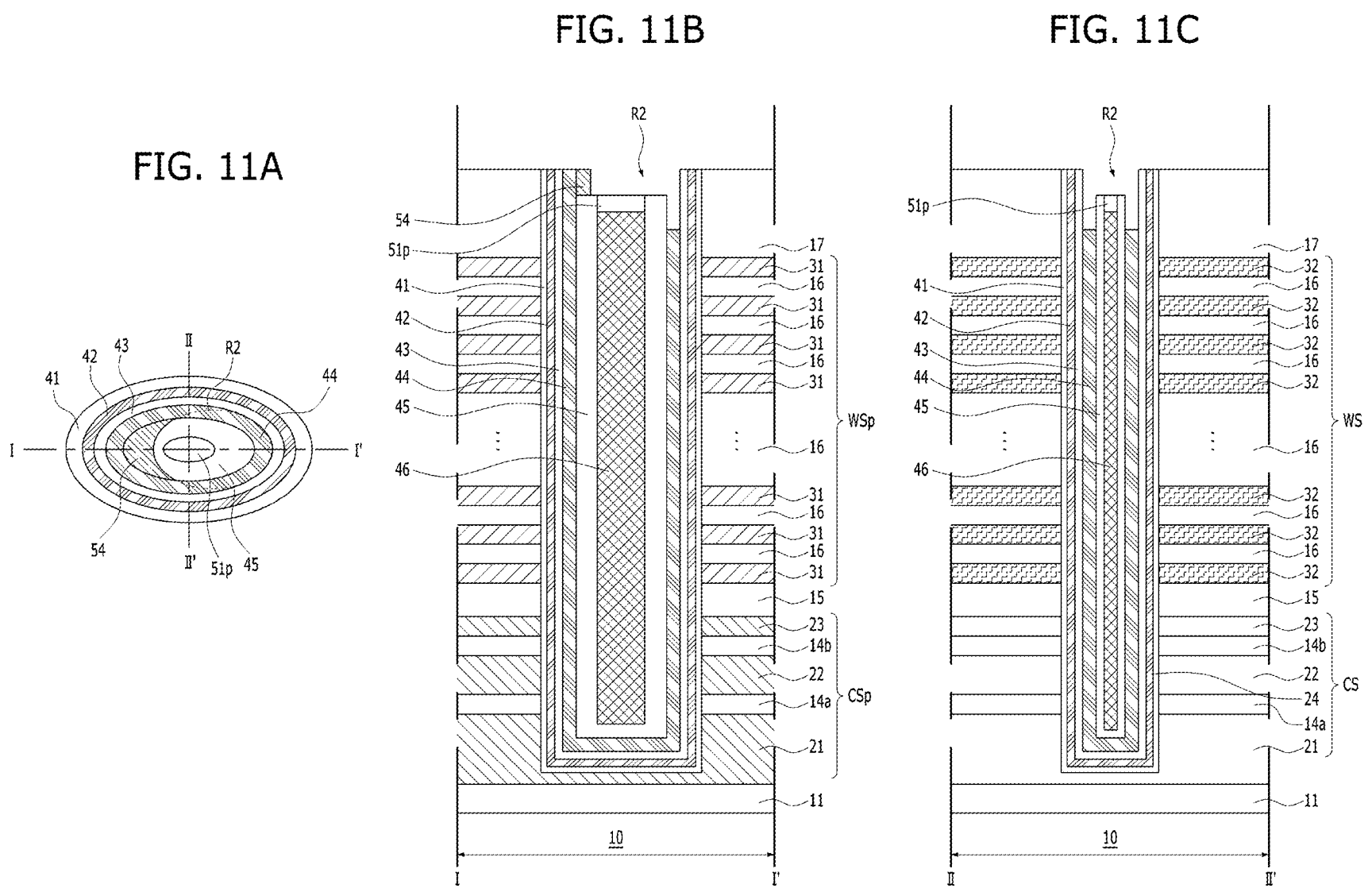

Referring to FIGS. 11A to 11C, the method may further include forming a second recess R2 by partially removing the preliminary channel pad 54p and the channel layer 44. The second recess R2 may have an oval shape when viewed in the plan view of FIG. 11A. With respect to the orientation of FIG. 11A, a center of the second recess R2 moves to the right side from a center of the first recess R1, and the oval shape of the second recess R2 may have the longest length in the direction corresponding to the line I-I', which is shorter than a corresponding length of an outer circumference of the channel layer 44, and have the longest length in the direction corresponding to the line II-II', which is shorter than a corresponding length of the outer circumference of the channel layer 44 and longer than a corresponding length of the first recess R1. A channel pad 54 may be formed by remaining a portion of the preliminary channel pad 54p on a part of the inner surface of the channel layer 44 at the left side of the second recess R2 in the direction corresponding to the line I-I'.

Referring to FIG. 11B, after partially removing the preliminary channel pad 54p, the remaining portion of the preliminary channel pad 54p may form the channel pad 54. The remaining portion of the preliminary channel pad 54p may correspond to a difference between the first recess R1 and the second recess R2. A part of an upper portion of the channel layer 44, between the filling layer 45 and the tunneling layer 43, may be removed so that the upper end of the channel layer 44 may be recessed. The recessed upper end of the channel layer 44 may be at a lower level than upper ends of the tunneling layer 43 and the filling layer 45.

Figures 12A, 12B, 12C:
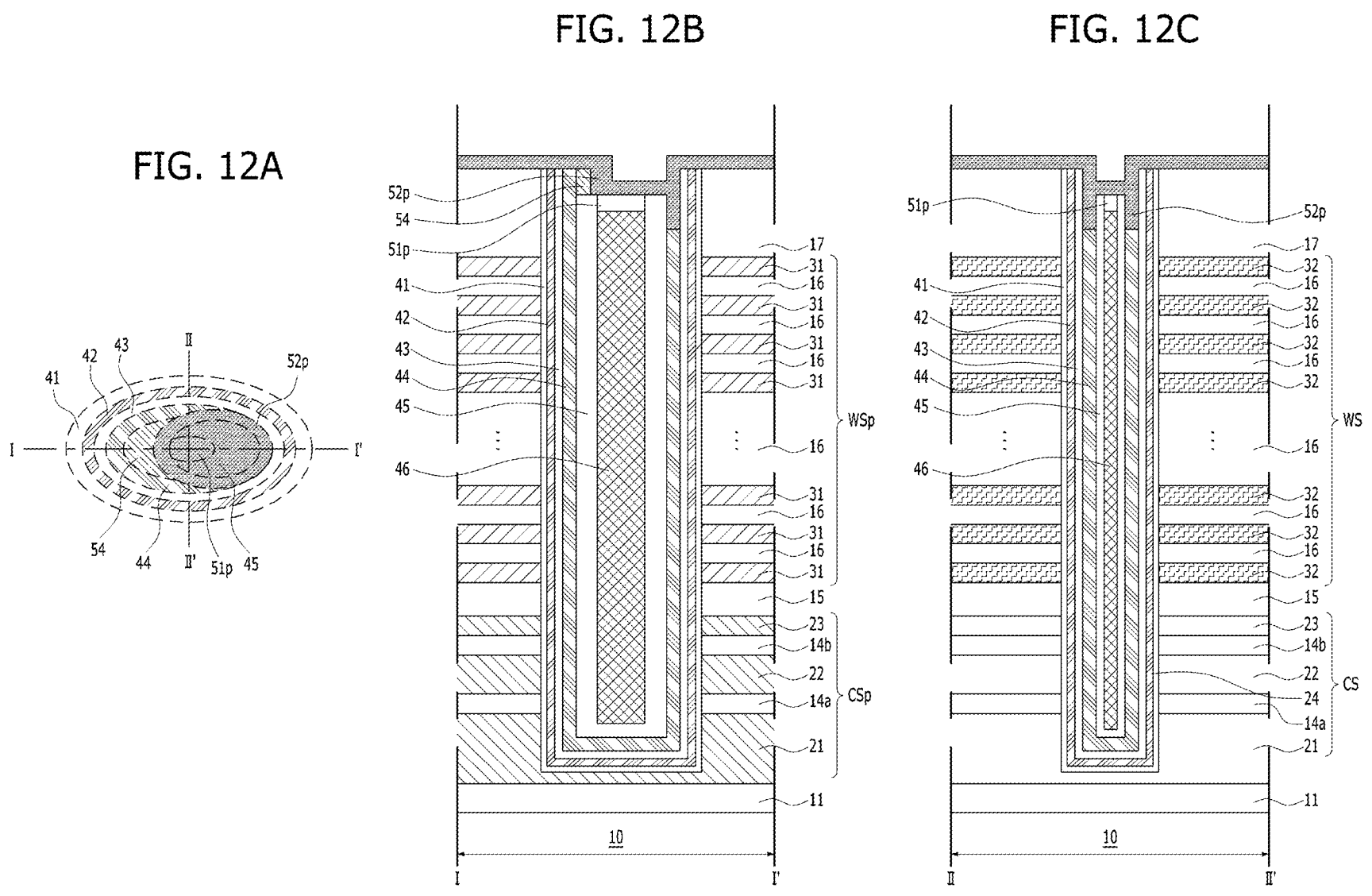

Referring to FIGS. 12A to 12C, the method may further include forming a preliminary upper spacing pattern 52p in the second recess R2. The forming of the preliminary upper spacing pattern 52p may include forming an oxidized silicon layer on the exposed side surface of the channel pad 54 in the second recess R2 and an exposed surface of the channel layer 44 by performing an oxidation process, and then conformally forming a silicon oxide layer along a profile of the second recess R2 by performing a deposition process. As shown in FIG. 12A, the elements of the channel pillar structure 60 are indicated by dotted lines as they will not be visible because of the preliminary upper spacing pattern 52p.

Figures 13A, 13B, 13C:
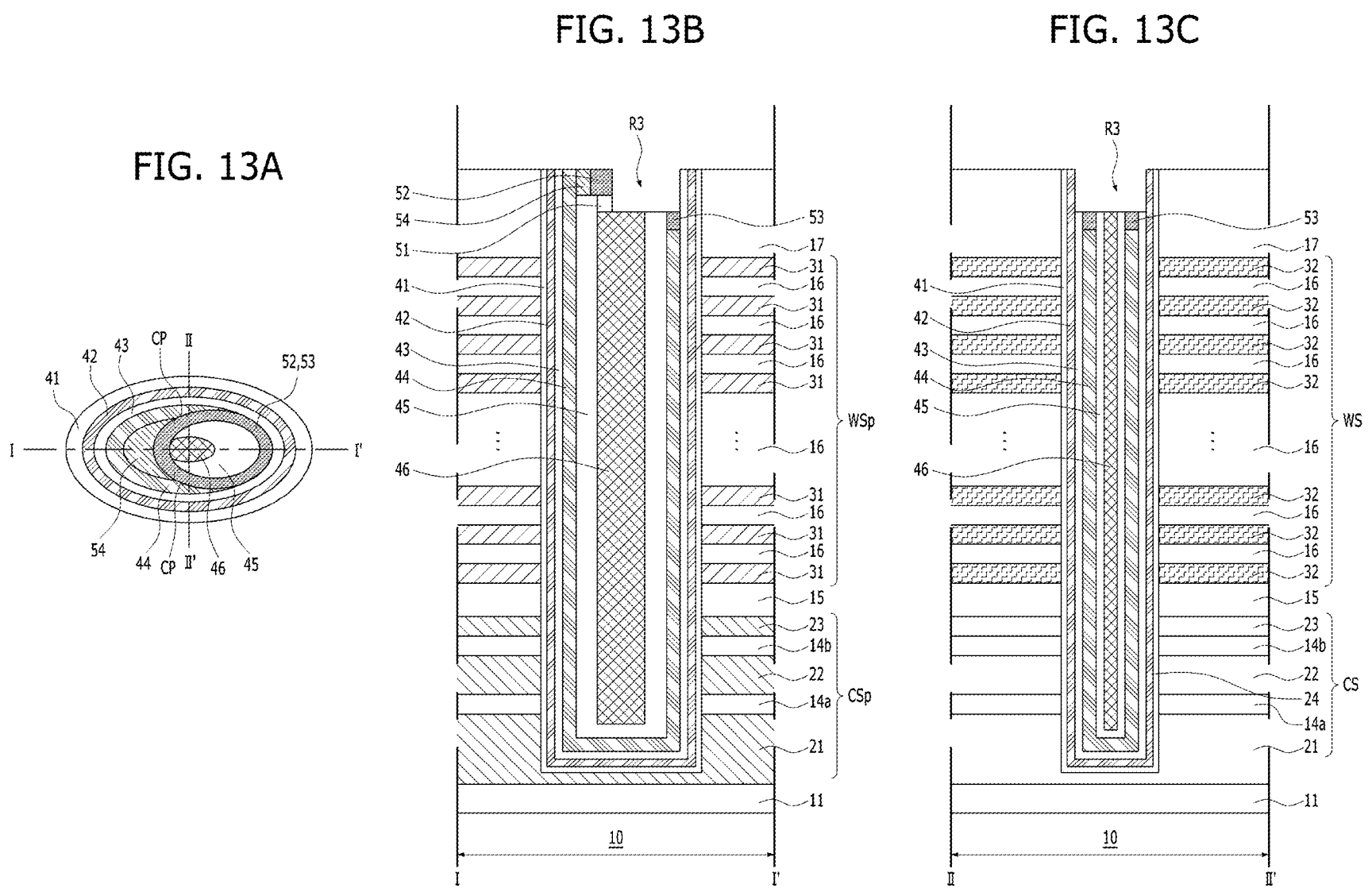

Referring to FIGS. 13A to 13C, the method may further include forming a third recess R3 defining a lower spacing pattern 51, a upper spacing pattern 52, and a buried spacing pattern 53 by partially removing the preliminary upper spacing pattern 52p, the preliminary lower spacing pattern 51p, and the filling layer 45 by performing an etching process until an upper surface of the back gate electrode 46 is exposed. The lower spacing pattern 51, the upper spacing pattern 52, and the buried spacing pattern 53 may be exposed in the third recess R3. The third recess R3 may expose the upper surface of the back gate electrode 46. The third recess R3 may also expose an upper surface of the filling layer 45 by partially removing the filling layer 45. Accordingly, the exposed upper surface of the filling layer 45 may be co-planar with the exposed upper surface of the back gate electrode 46. Since the oxidized silicon layer is denser than the deposited silicon oxide layer and has better etching resistance, the oxidized silicon layer may remain even when most of the silicon oxide layer is removed in the etching process. Accordingly, when the preliminary upper spacing pattern 52p is removed, the oxidized silicon layer remains so that the upper spacing pattern 52 and the buried spacing pattern 53 can be formed. Referring to FIG. 13A, the upper spacing pattern 52 and the buried spacing pattern 53 may be vertically connected with each other at connection points CP. That is, the upper spacing pattern 52 and the buried spacing pattern 53 may be materially continued with each other.

Figures 14A, 14B, 14C:
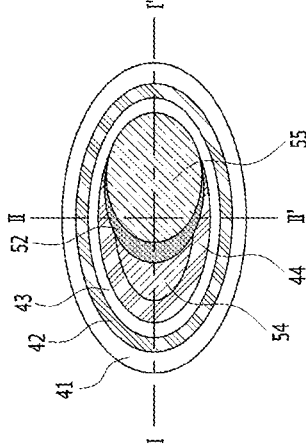

Referring to FIGS. 14A to 14C, the method may further include forming a back gate electrode pad 55 to fill the third recess R3 by performing a deposition process. The back gate electrode pad 55 may include a conductive material such as an N-typed ion-doped silicon. The method may further include co-planarizing upper surfaces of the upper insulating layer 17 and the back gate electrode pad 55 by performing a CMP process.

Figures 15A, 15B, 15C:
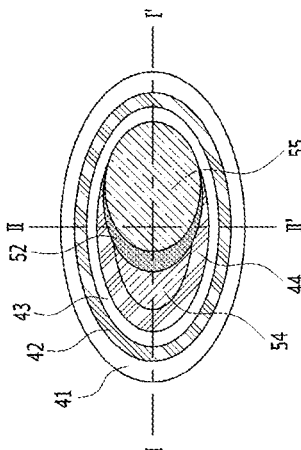

Referring to FIGS. 15A to 15C, the method may further include depositing a capping insulating layer 18 on a resultant structure obtained by filling the third recess R3, and forming a word line stack WS and a common source electrode stack CS by a word line forming process and a common source electrode forming process, respectively. The capping insulating layer 18 may include a silicon oxide based material, a silicon nitride based material, or a combination thereof. The word line forming process may include forming word lines 32 by removing the sacrificial insulating layers 31 of the preliminary word line stack WSp to form empty spaces between the interlayer insulating layers 16 and filling the empty spaces with a conductive material. The common source electrode forming process may include removing the intermediate source electrode layer 22. By removing the intermediate source electrode layer 22, the blocking layer 41 is partially exposed. After that, the exposed portion of the blocking layer 41 and corresponding portions of the trap layer 42 and the tunneling layer 43 are removed until the channel layer 44, the lower source electrode layer 21, and the upper source electrode layer 23 are exposed. An empty space formed by removing the exposed portion of the blocking layer 41 and the corresponding portions of the trap layer 42 and the tunneling layer 43 is filled with a conductive material such as an N-type ion-doped silicon to form a source electrode connection part 24 that connects the lower source electrode layer 21, the intermediate source electrode layer 22, and the upper source electrode layer 23 to the channel layer 44. The intermediate source electrode layer 22 may be removed and then re-formed.

Figures 16A, 16B, 16C:
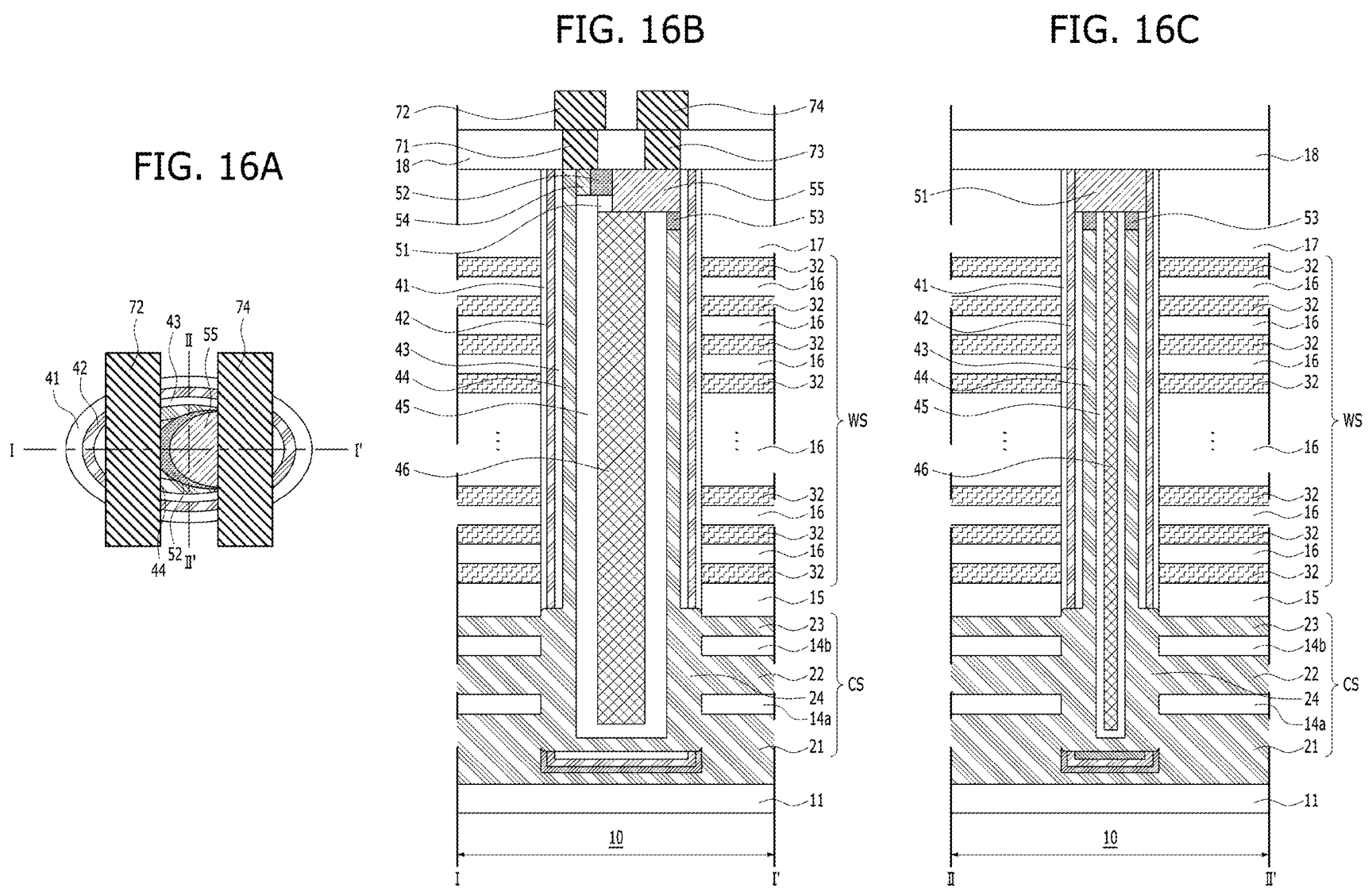

Referring to FIGS. 16A to 16C, the method may further include forming a channel contact 71, a back gate electrode contact 73, a bit line 72, and a back gate electrode interconnection 74. The channel contact 71 may vertically pass through the capping insulating layer 18 to be connected to the channel layer 44 and the channel pad 54. The back gate electrode contact 73 may vertically pass through the capping insulating layer 18 to be connected to the back gate electrode pad 55. The bit line 72 may be formed on the channel contact 71, and the back gate electrode interconnection 74 may be formed on the back gate electrode contact 73. The bit line 72 and the back gate electrode interconnection 74 may extend parallel to each other. The channel contact 71, the back gate electrode contact 73, the bit line 72, and the back gate electrode interconnection 74 may include a conductive material such as a N-type ion-doped silicon, a metal silicide, a metal alloy, a metal compound, or a metal.

FIGS. 17 to 25 are longitudinal cross-sectional views illustrating a method of manufacturing a three dimensional semiconductor device according to another embodiment of the present disclosure. The three dimensional semiconductor device of this embodiment corresponds to the three dimensional semiconductor device illustrated in FIG. 3.

Figure 17:
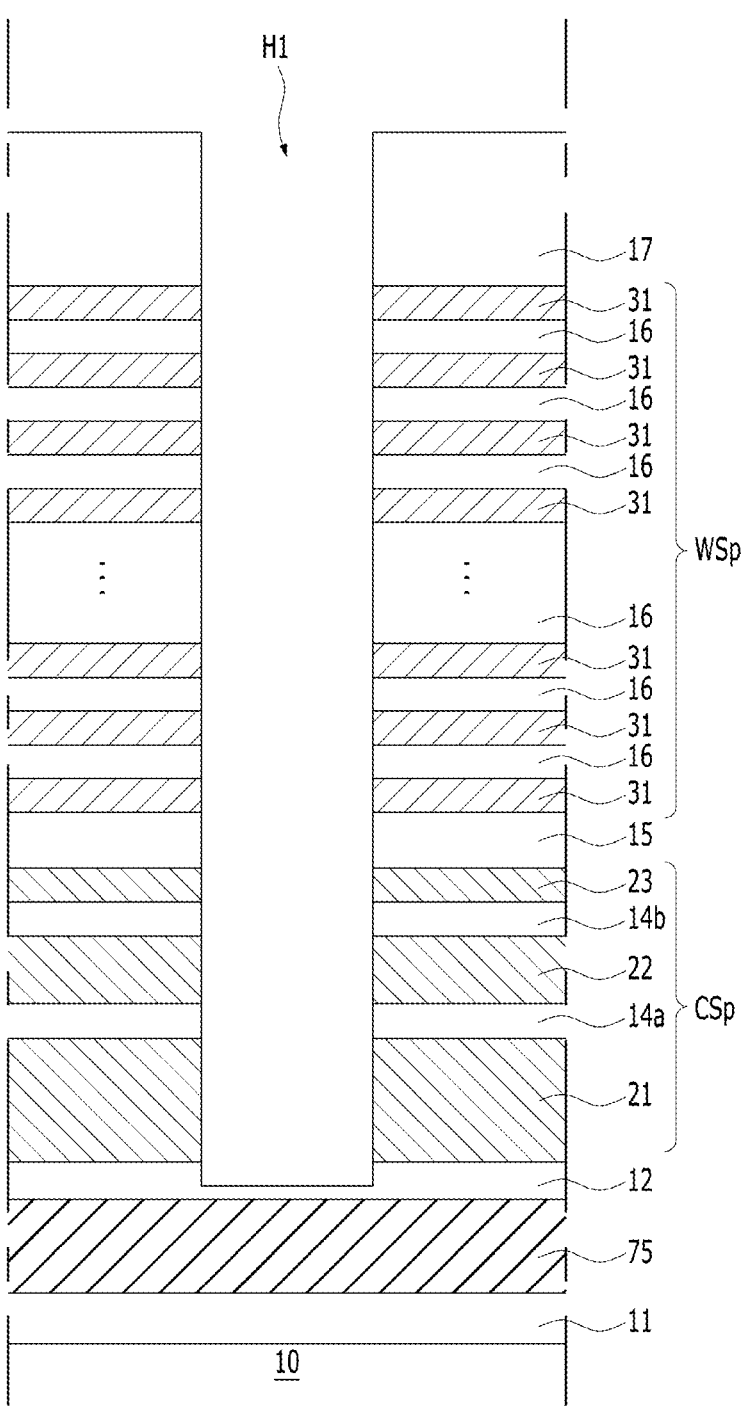
FIGS. 17 to 25 are longitudinal cross-sectional views illustrating a method of manufacturing a three dimensional semiconductor device according to another embodiment of the present disclosure.

Referring to FIG. 17, the method of manufacturing the three dimensional semiconductor device may include forming a lower insulating layer 11 on a substrate 10, forming a back gate electrode layer 75 on the lower insulating layer 11, forming a buffer insulating layer 12 on the back gate electrode layer 75, forming a preliminary common source electrode stack CSp on the buffer insulating layer 12, forming an intermediate insulating layer 15 on the preliminary common source electrode stack CSp, forming a preliminary word line stack WSp on the intermediate insulating layer 15, forming an upper insulating layer 17 on the preliminary word line stack WSp, and forming a channel hole H1. The buffer insulating layer 12 may include an insulating material such as a silicon oxide based material. The back gate electrode layer 75 may include a conductive layer such as an N-type ion-doped silicon layer formed between the lower insulating layer 11 and the buffer insulating layer 12. The channel hole H1 may vertically penetrate the upper insulating layer 17, the preliminary word line stack WSp, the intermediate insulating layer 15, and the preliminary common source electrode stack CSp. A bottom surface of the channel hole H1 may be located in the buffer insulating layer 12. That is, the channel hole H1 does not completely penetrate the buffer insulating layer 12. The channel hole H1 of this embodiment has an oval shape similar to that of the channel hole H1 shown in FIG. 5A.

Figure 18:
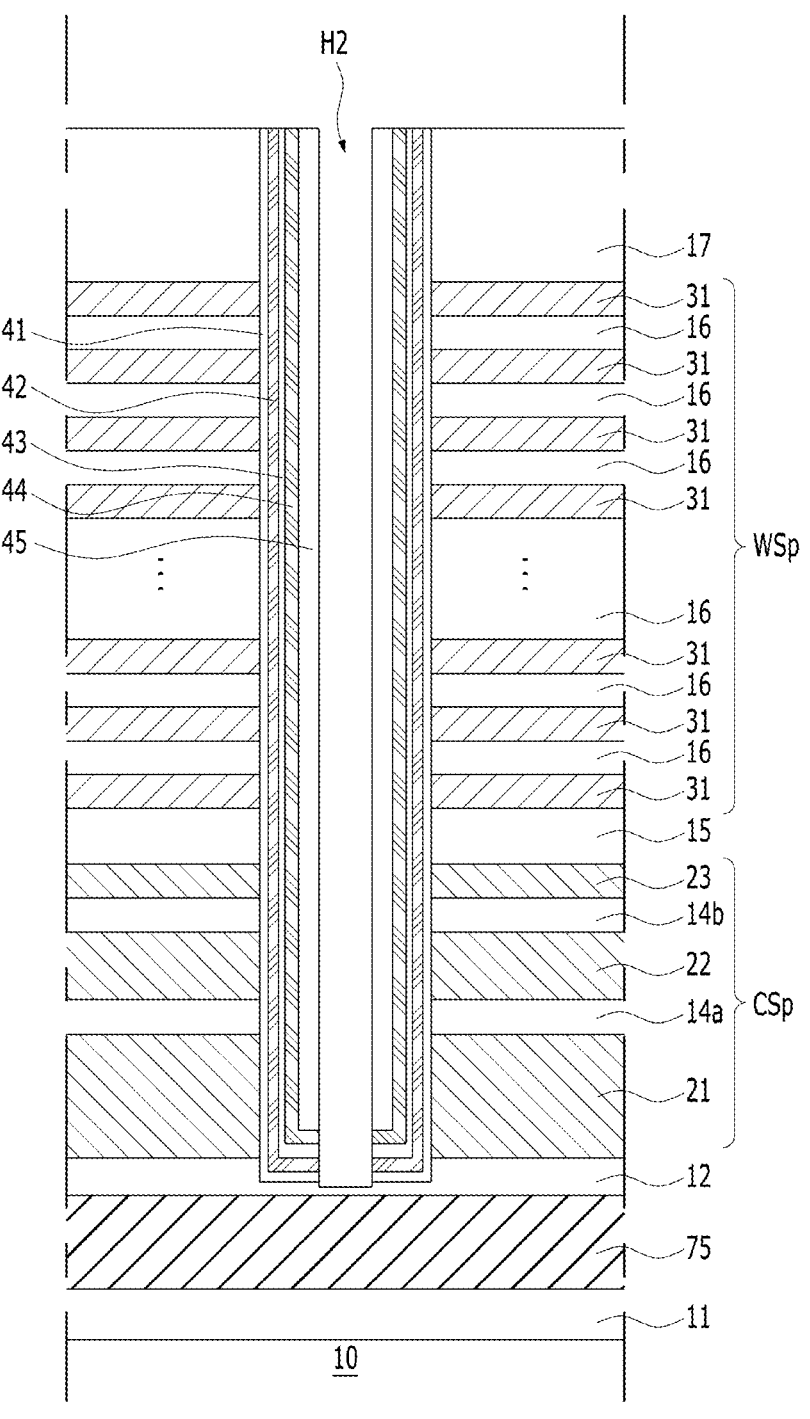

Referring to FIG. 18, the method may further include sequentially depositing a blocking layer 41, a trap layer 42, a tunneling layer 43, and a channel layer 44, on a bottom surface and a side surface of the channel hole H1, i.e., along a profile of the channel hole H1, forming a filling layer 45 to fill the remaining portion of the channel hole H1, and forming a preliminary electrode hole H2 vertically penetrating the filling layer 45 along a center line of the filling layer 45 by performing an etching process. A bottom surface of the preliminary electrode hole H2 may be located in the buffer insulating layer 12. That is, the preliminary electrode hole H2 may vertically penetrate bottom surfaces of the blocking layer 41, the trap layer 42, the tunneling layer 43, the channel layer 44, and the filling layer 45. Lower ends of the blocking layer 41, the trap layer 42, the tunneling layer 43, and the channel layer 44, and the filling layer 45 may be exposed by forming the preliminary electrode hole H2. Upper ends of the blocking layer 41, the trap layer 42, the tunneling layer 43, the channel layer 44, and the filling layer 45 may also be exposed by planarizing the blocking layer 41, the trap layer 42, the tunneling layer 43, the channel layer 44, and the filling layer 45 until an upper surface of the upper insulating layer 17 is exposed after forming the blocking layer 41, the trap layer 42, the tunneling layer 43, the channel layer 44, and the filling layer 45.

Figure 19:
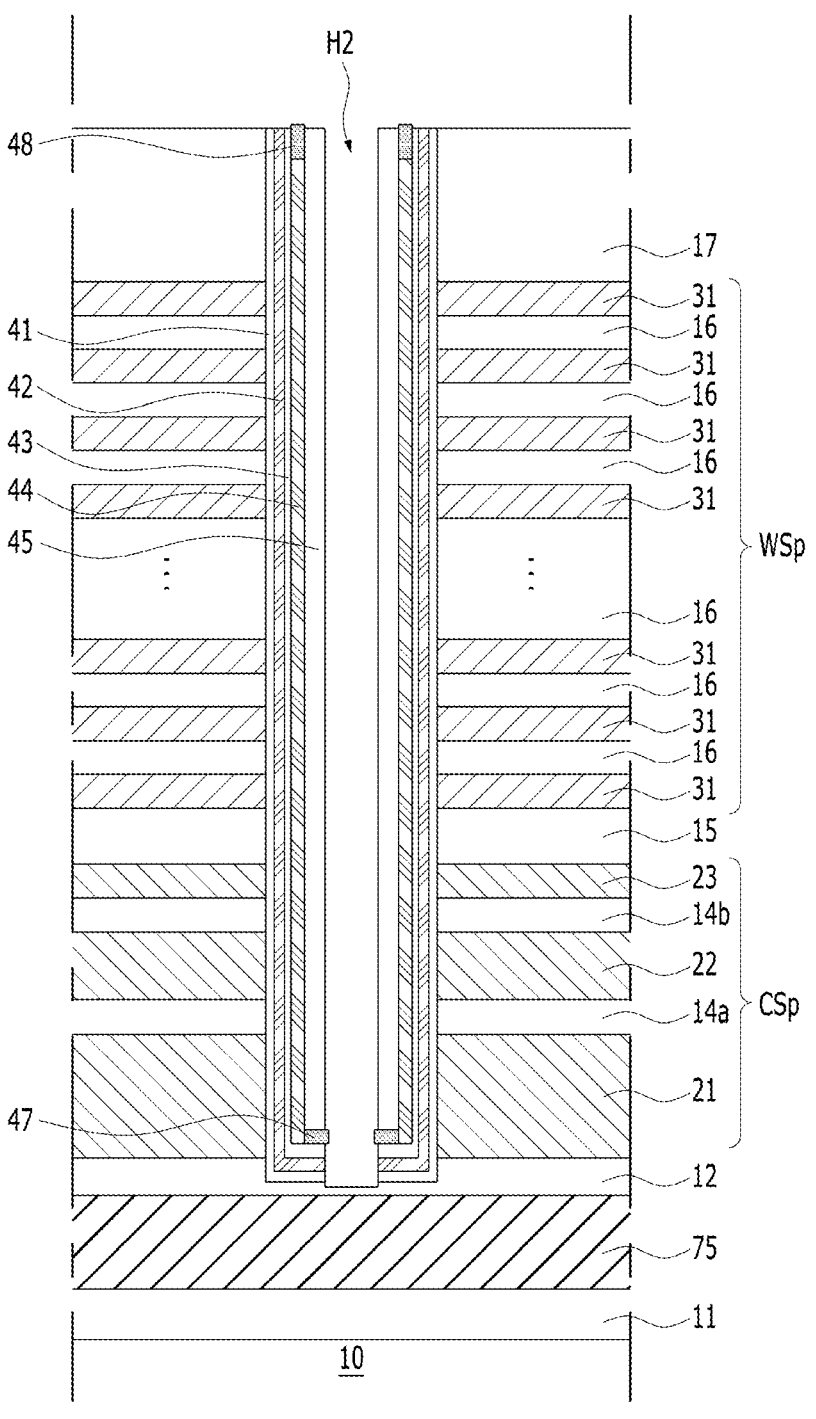

Referring to FIG. 19, the method may further include forming spacing patterns 47 and 48 by oxidizing the exposed upper and lower ends of the channel layer 44. The spacing patterns 47 and 48 may include an electrode spacing pattern 47 formed by oxidizing the lower end of the channel layer 44 and a channel spacing pattern 48 formed by oxidizing the upper end of the channel layer 44. The electrode spacing pattern 47 may laterally protrude into the preliminary electrode hole H2. The channel spacing pattern 48 may upwardly protrude from the upper surface of the upper insulating layer 17. The spacing patterns 47 and 48 may include oxidized silicon.

Figure 20:
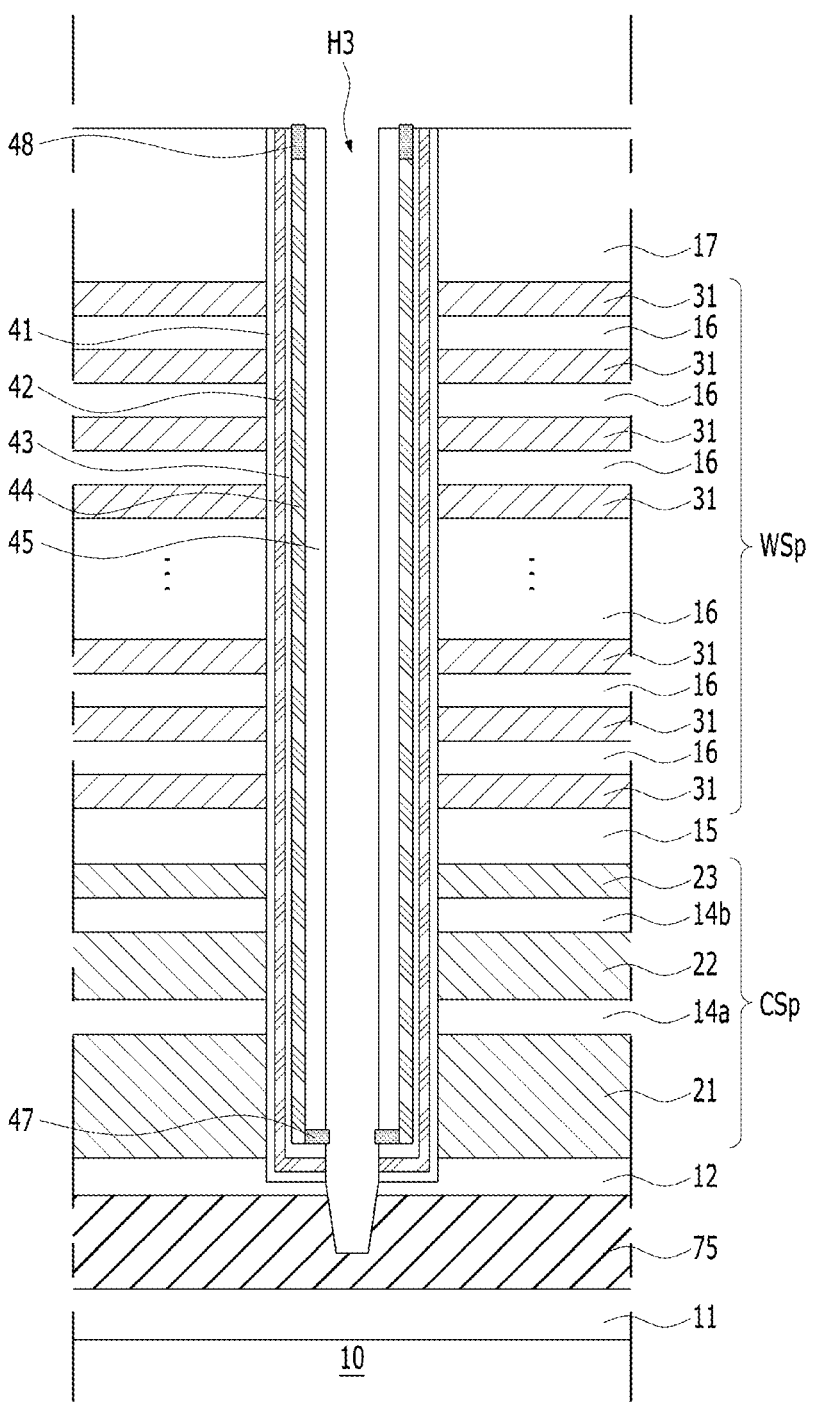

Referring to FIG. 20, the method may further include forming an electrode hole H3 by widening the preliminary electrode hole H2 downwardly so that a bottom surface of the electrode hole H3 may be located in the back gate electrode layer 75. That is, the back gate electrode layer 75 may be exposed in a lower portion of the electrode hole H3.

Figure 21:
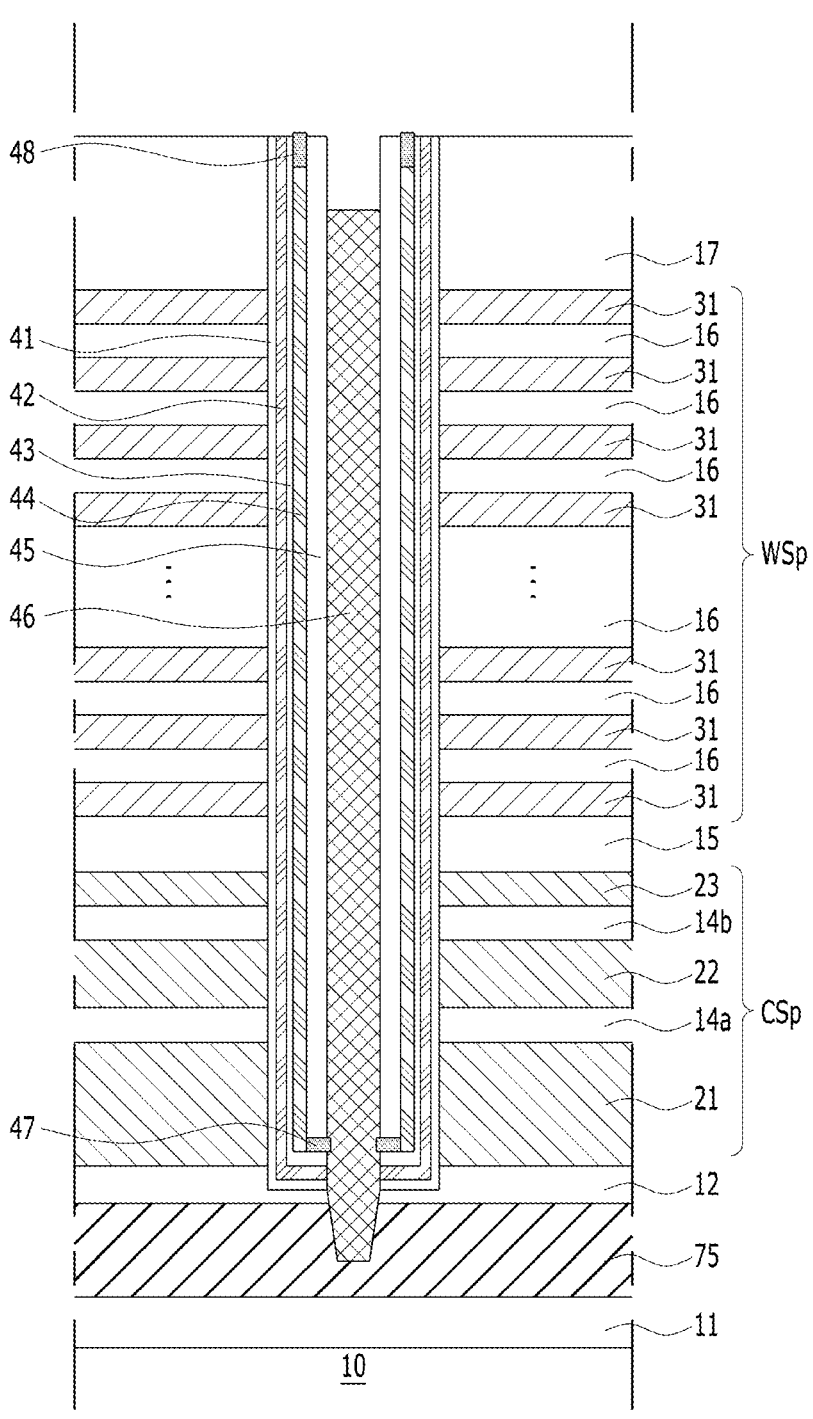

Referring to FIG. 21, the method may further include forming a back gate electrode 46 by partially filling the electrode hole H3 with a conductive material in a vertical direction perpendicular to a top surface of the substrate 10. An upper surface of the back gate electrode 46 may be at a lower level than the upper surface of the upper insulating layer 17. The back gate electrode 46 may include a conductive material such as an N-type ion-doped silicon. The back gate electrode 46 and the back gate electrode layer 75 may be materially continued and electrically connected with each other.

Figure 22:
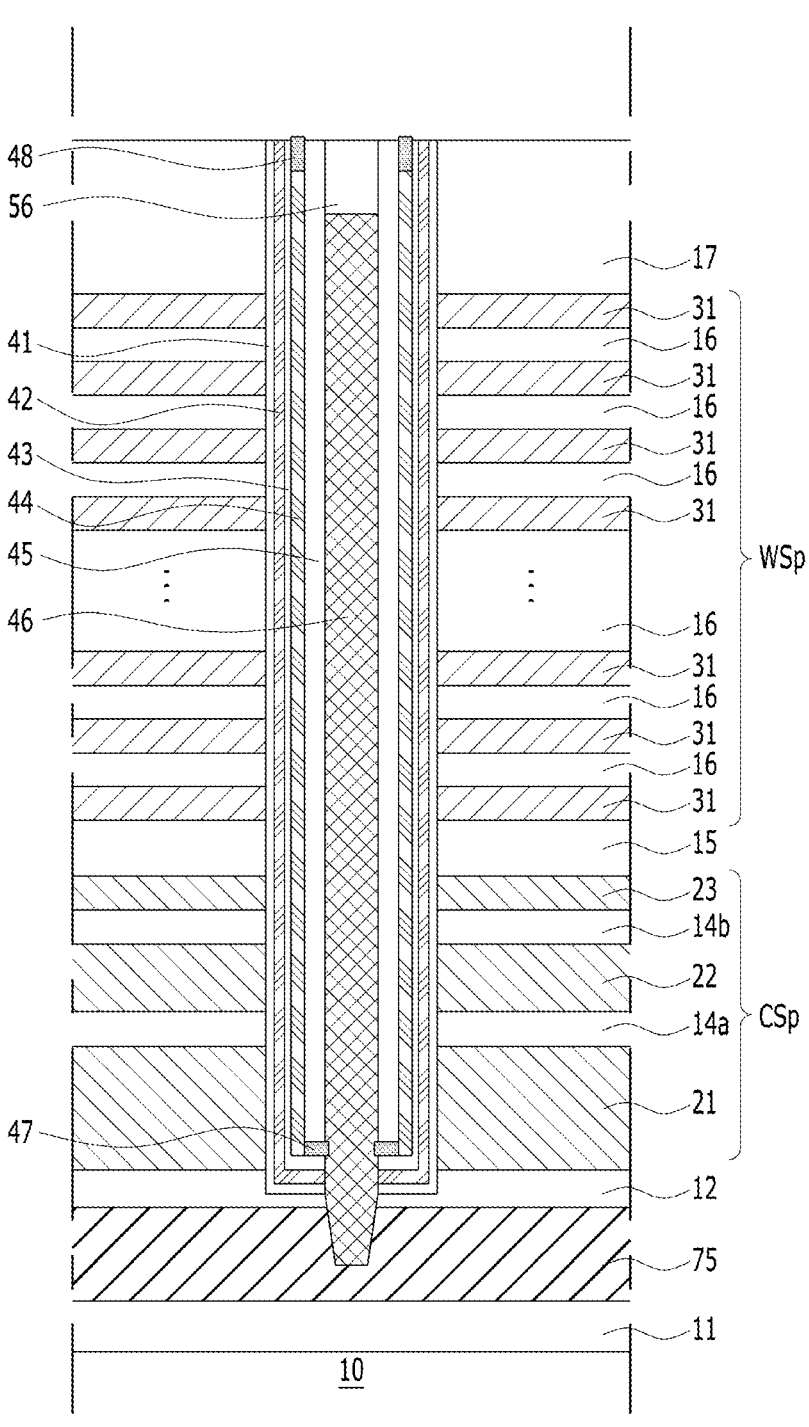

Referring to FIG. 22, the method may further include forming a pad spacing pattern 56 on the back gate electrode 46 in the electrode hole H3 by performing a deposition process. The pad spacing pattern 56 may include an insulating material such as a silicon oxide. The method may further include co-planarizing upper surfaces of the pad spacing pattern 56 and the upper insulating layer 17 by performing a CMP process. In one embodiment, the channel spacing pattern 48 may be removed during the CMP process.

Figure 23:
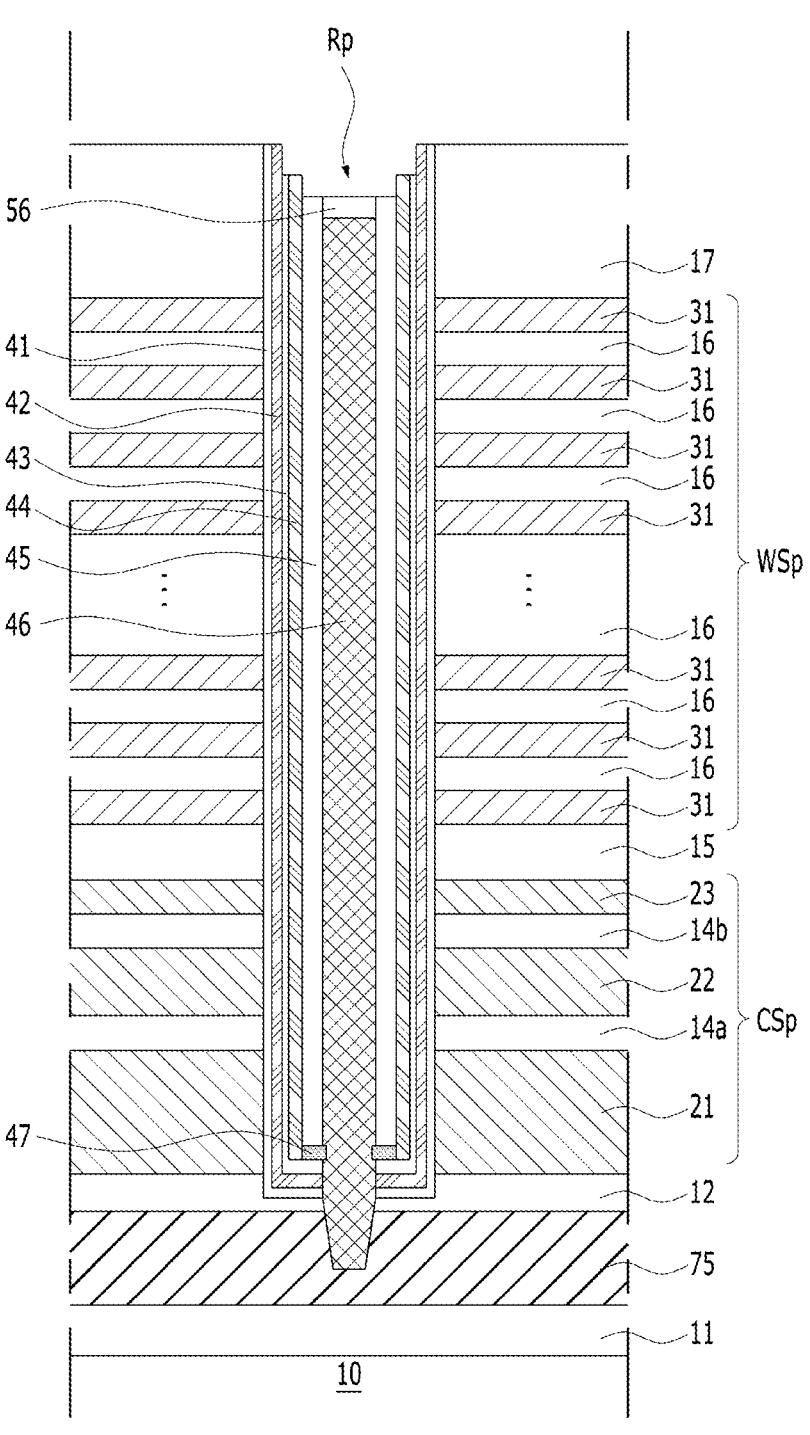

Referring to FIG. 23, the method may further include forming a pad recess Rp by performing an etching process. During the etching process, the channel spacing pattern 48 may be removed, and upper surfaces of the filling layer 45 and the pad spacing pattern 56 may be recessed. A portion of the tunneling layer 43 contacting the channel spacing pattern 48 may be removed during the etching process. An upper end of the channel layer 44 may be exposed in the pad recess Rp. In another embodiment, the channel spacing pattern 48 may remain.

Figure 24:
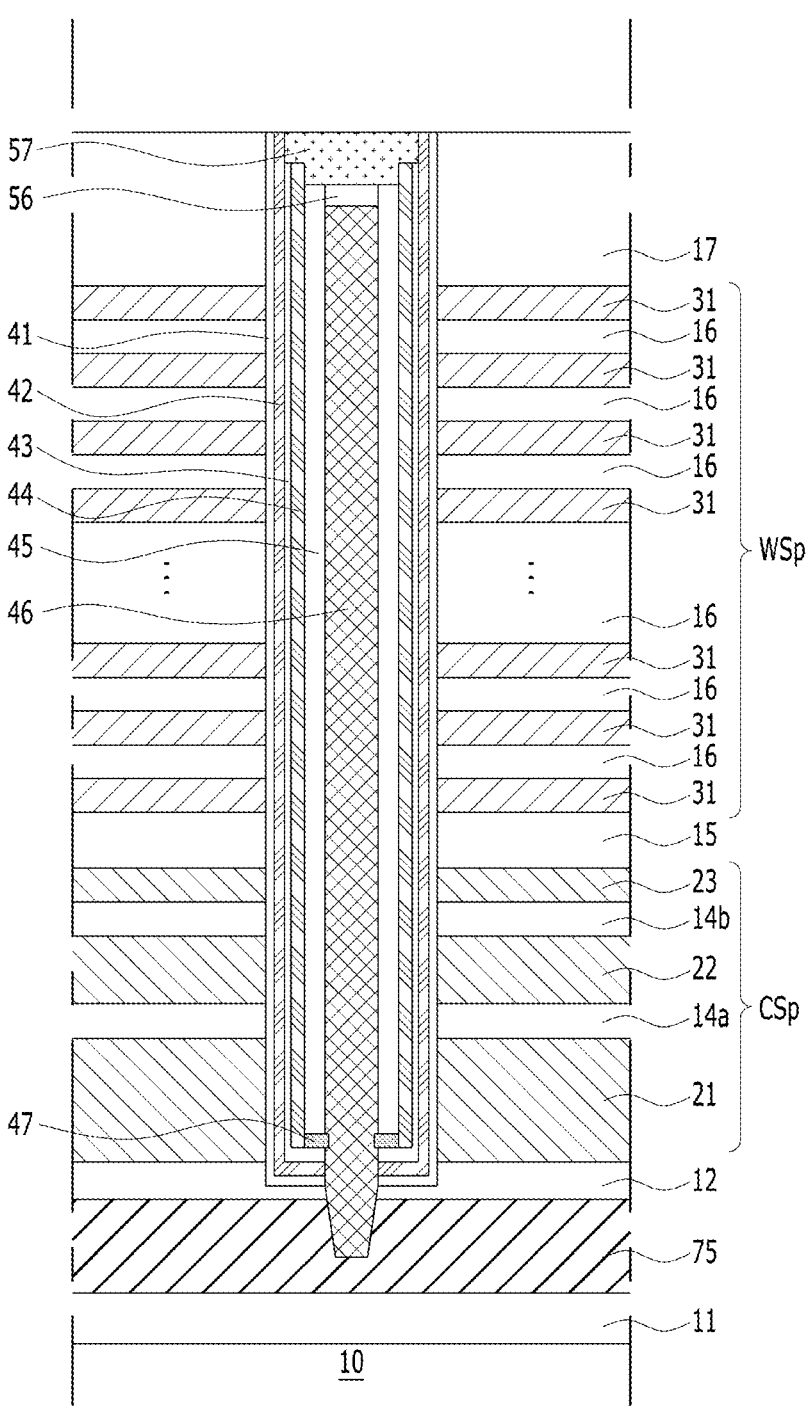

Referring to FIG. 24, the method may further include forming a channel pad 57 in the pad recess Rp by performing a deposition process. The channel pad 57 may include a conductive material such as an N-type ion-doped silicon, a metal silicide, a metal alloy, a metal compound, or a metal. The method may further include co-planarizing upper surfaces of the channel pad 57 and the upper insulating layer 17 by performing a CMP process on the deposited conductive material. Through the above processes, the channel pillar structure 60 shown in FIG. 3 may be formed. In one embodiment, the channel spacing pattern 48 may be removed during this process.

Figure 25:
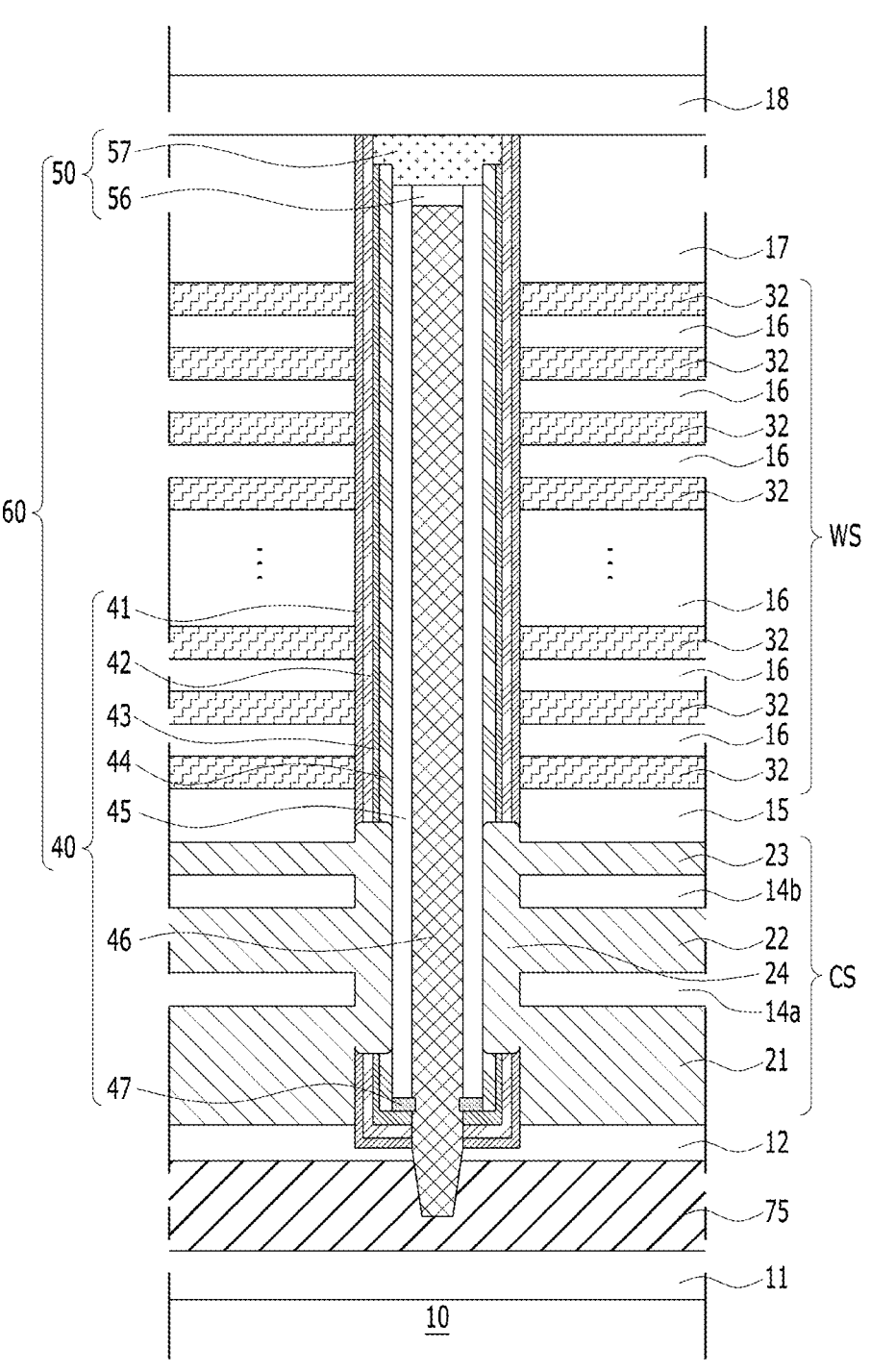

Referring to FIG. 25, the method may further include depositing a capping insulating layer 18 on a resultant structure of FIG. 24, forming a word line stack WS and a common source electrode stack CS by performing a word line forming process and a common source electrode forming process, respectively. Thereafter, referring to FIG. 3, the method may further include forming the channel contact 71 in the capping insulating layer 18 and forming the bit line 72 on the channel contact 71 and the capping insulating layer 18 to be in contact with the channel contact 71.

Other elements and processes not described with reference to FIGS. 17 to 25 may be understood with reference to FIGS. 4A to 4C to 16A to 16C.

According to the embodiments of the present disclosure, a back gate voltage may be applied to the memory cells through the back gate electrode. Accordingly, a voltage that is applied to the word lines to operate the memory cells can be lowered. The word lines and the interlayer insulating layers between the word lines can be thinned. A stack height of the word line stack can be lowered. The number of word lines included in the word line stack can be increased. As a result, the integration degree of the three dimensional semiconductor device can be improved. The performance and capacity of the three dimensional semiconductor device can be improved.

While the present invention has been described with respect to the specific embodiments, it will be apparent to those skilled in the art that various changes and modifications may be made without departing from the spirit and scope of the invention as defined in the following claims.

What is claimed is:

1. A three dimensional semiconductor device, comprising:
   a word line stack over a substrate; and
   a channel pillar structure passing through the word line stack in a vertical direction perpendicular to a top surface of the substrate,
   wherein the channel pillar structure includes a channel structure,
   wherein the channel structure includes a blocking layer, a trap layer, a tunneling layer, a channel layer, a filling layer, and a back gate electrode,
   wherein the channel structure has a pillar shape,
   wherein the channel pillar structure further includes a pad structure over the channel structure,
   wherein the pad structure includes a back gate electrode pad formed over and electrically connected to the back gate electrode, and wherein the back gate electrode pad has an offset and eccentric shape with respect to the channel structure in a top view.

2. The three dimensional semiconductor device of claim 1, wherein the pad structure further includes:

a channel pad electrically connected to the channel layer; and a spacing pattern electrically insulating the channel pad from the back gate electrode.

3. The three dimensional semiconductor device of claim 2, wherein:

the back gate electrode pad has a disk shape, and the back gate electrode pad has an eccentric shape with respect to the back gate electrode in a top view.

4. The three dimensional semiconductor device of claim 2, wherein the spacing pattern includes a first spacing pattern between a side surface of the channel pad and a side surface of the back gate electrode pad.

5. The three dimensional semiconductor device of claim 4, wherein the first spacing pattern has a half-ring shape in a top view.

6. The three dimensional semiconductor device of claim 4, wherein the spacing pattern further includes a second spacing pattern between the side surface of the back gate electrode pad and a side surface of the filling layer.

7. The three dimensional semiconductor device of claim 6, wherein the second spacing pattern has a half-ring shape in the top view.

8. The three dimensional semiconductor device of claim 6, wherein a thickness of the first spacing pattern is greater than a thickness of the second spacing pattern in a horizontal direction parallel to the top surface of the substrate.

9. The three dimensional semiconductor device of claim 6, wherein the first spacing pattern includes oxidized silicon, and the second spacing pattern includes a silicon oxide based material.

10. The three dimensional semiconductor device of claim 6, wherein the spacing pattern further includes a third spacing pattern between a bottom surface of the back gate electrode pad and an upper end of the channel layer.

11. The three dimensional semiconductor device of claim 10, wherein the first spacing pattern and the third spacing pattern are in a ring shape in a top view.

12. The three dimensional semiconductor device of claim 2, further comprising:

a channel contact over the channel pad;

a back gate electrode contact over the back gate electrode pad;

a bit line over the channel contact; and a back gate interconnection over the back gate electrode contact.

13. The three dimensional semiconductor device of claim 1, further comprising:

a back gate electrode layer between the substrate and the word line stack in the vertical direction, and wherein the back gate electrode layer is electrically connected to the back gate electrode.

14. The three dimensional semiconductor device of claim 13, further comprising:

a pad spacing pattern over an upper surface of the back gate electrode;

a channel pad over the pad spacing pattern;

a channel contact electrically connected to the channel pad; and a bit line electrically connected to the channel contact.

15. The three dimensional semiconductor device of claim 13, further comprising:

an electrode spacing pattern insulating the back gate electrode from the channel layer, wherein:

the back gate electrode passes through bottom surfaces of the filling layer, the channel layer, the tunneling layer, the trap layer, and the blocking layer in the vertical direction to be connected to the back gate electrode layer, and the electrode spacing pattern is disposed between a side surface of the back gate electrode and a side surface of the channel layer at a lower end of the channel layer.

16. The three dimensional semiconductor device of claim 15, wherein the electrode spacing pattern has a ring shape surrounding the side surface of the back gate electrode.

17. The three dimensional semiconductor device of claim 1, further comprising:

a plurality of source electrode layers between the substrate and the word line stack, wherein the plurality of source electrode layers are electrically connected to the channel layer.

18. The three dimensional semiconductor device of claim 2, wherein a top surface of the back gate electrode pad is disposed at the same level as a top surface of the channel pad.

19. The three dimensional semiconductor device of claim 1, wherein at least a portion of the back gate electrode pad is vertically overlapped with the channel layer.

* * * * *